US006891391B2

(12) United States Patent
Hiroki

(10) Patent No.: US 6,891,391 B2
(45) Date of Patent: May 10, 2005

(54) MEASURING METHOD, INSPECTION METHOD, INSPECTION DEVICE, SEMICONDUCTOR DEVICE, METHOD OF MANUFACTURING A SEMICONDUCTOR DEVICE, AND METHOD OF MANUFACTURING AN ELEMENT SUBSTRATE

(75) Inventor: Masaaki Hiroki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/144,586

(22) Filed: May 13, 2002

(65) Prior Publication Data

US 2002/0173060 A1 Nov. 21, 2002

(30) Foreign Application Priority Data

May 15, 2001 (JP) ...................................... 2001-144193

(51) Int. Cl.[7] .............................................. G01R 31/26
(52) U.S. Cl. ....................................................... 324/765
(58) Field of Search ............................. 324/158.1, 759, 324/763, 764, 765, 546, 547, 150, 528, 531, 173, 262; 363/22, 97

(56) References Cited

U.S. PATENT DOCUMENTS

| 5,428,521 | A | * | 6/1995 | Kigawa et al. ................ 363/22 |
| 5,854,492 | A | | 12/1998 | Chinone et al. |
| 6,496,166 | B1 | | 12/2002 | Onozawa et al. |
| 2002/0130675 | A1 | | 9/2002 | Hiroki ......................... 324/750 |
| 2002/0132383 | A1 | | 9/2002 | Hiroki et al. .................. 438/17 |
| 2003/0146771 | A1 | | 8/2003 | Moore |

FOREIGN PATENT DOCUMENTS

| JP | 06-349913 | 12/1994 |
| JP | 11-353433 | 12/1999 |
| JP | 2000-258482 | 9/2000 |
| WO | WO 01/88976 | 11/2001 |
| WO | WO 02/063675 | 8/2002 |

OTHER PUBLICATIONS

Aoshima, S. et al, "Improvement of the Minimum Detectability of Electro–Optic Sampling by Using a Structurally New Probe," OSA Proceedings on Picosecond Electronics and Optoelectronics, Gerhard Sollner & Jagdeep Shah, eds., vol. 9, pp. 64–69, (1991).

Takahashi, H. et al, "Improvement of Space–Dependent Sensitivity and Absolute Voltage Measurement in Noncontact Picosecond Electro–Optic Sampling," OSA Proceedings in Picosecond Electronics and Optoelectronics, Gerhard Sollner & Jagdeep Shah, eds., vol. 9, pp. 70–74, (1991).

(Continued)

Primary Examiner—David Zarneke
Assistant Examiner—Trung Q. Nguyen
(74) Attorney, Agent, or Firm—Cook, Alex, McFarron, Manzo, Cummings & Mehler, Ltd.

(57) ABSTRACT

An inspection method which simplifies an inspection step by eliminating the need to set probes on wiring or probe terminals, and an inspection device for performing the inspection step. A voltage is applied to each of inspected circuits or circuit elements to operate the same. Signal processing is performed on an output from each inspected circuit or circuit element during operation to form a signal (operation information signal) including information on the operating condition of the circuit or the circuit element. The operation information signal is amplified and the amplitude of an alternating current voltage separately input is modulated with the amplified operation information signal. The voltage of the modulated alternating current is read in a non-contact manner to determine whether the corresponding circuit or circuit element is non-defective or defective.

8 Claims, 18 Drawing Sheets

OTHER PUBLICATIONS

Aoshima, S. et al, "Internal Test of MMIC with E–O Sampling," Workshop 1: Optical/Microwave and Millimeter–Wave Technologies, 1993 Microwave Workshops and Exhibition, Microwave Workshop Digest, pp. 77–82 (1993).

Hui, S.Y. et al, Coreless Printed Circuit Board (PCB) Transformers—Fundamental Characteristics and Application Potential, IEEE Circuits and Systems, vol. 11, No. 3, pp. 3–15, (2000).

Finkenzeller, K., "The Principle and Application of Non-contact IC Card," RFID Handbook, p. 35, Taihei Kanno, pub., Nikkan Kogyo Shimbum, Tokyo, Japan, w/English translation, pp. 1–3, Feb. 26, (2001).

* cited by examiner

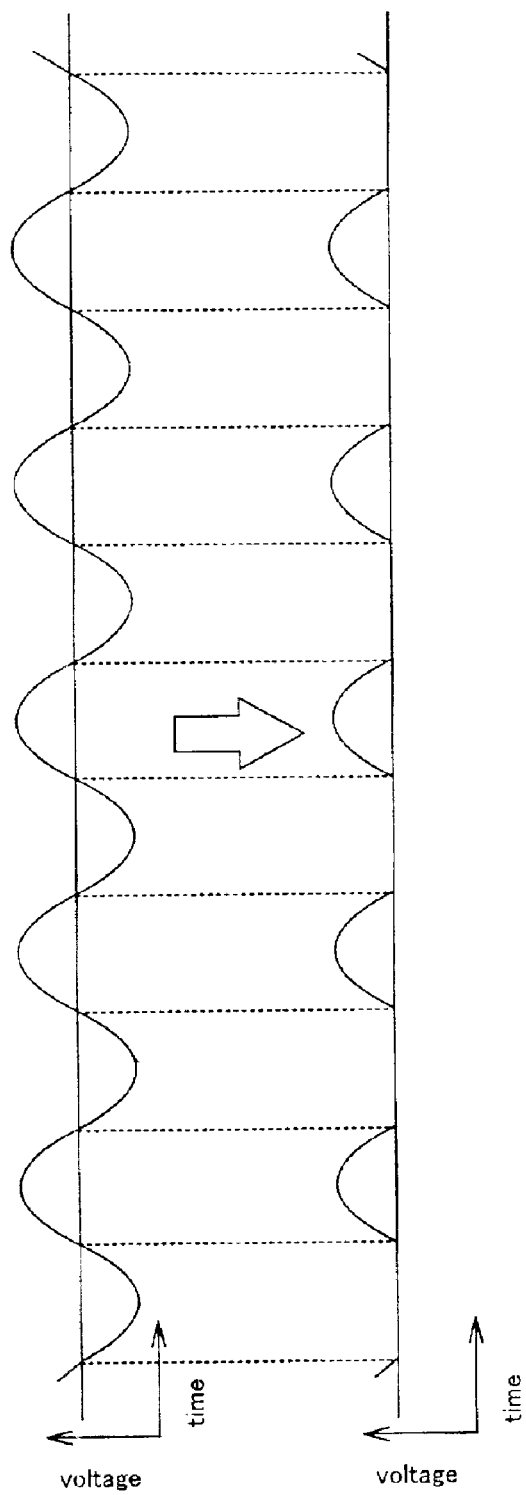

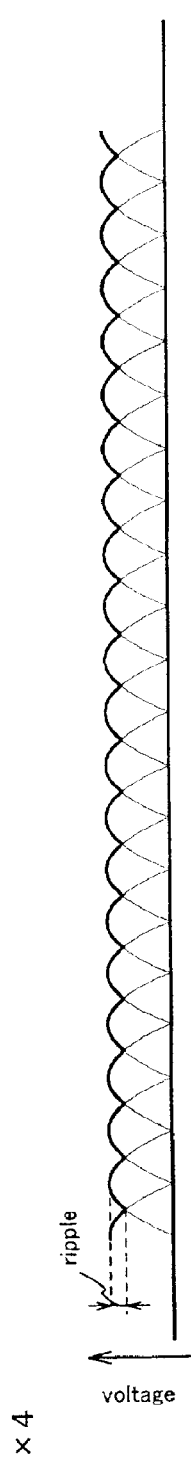
Fig. 8A ×4
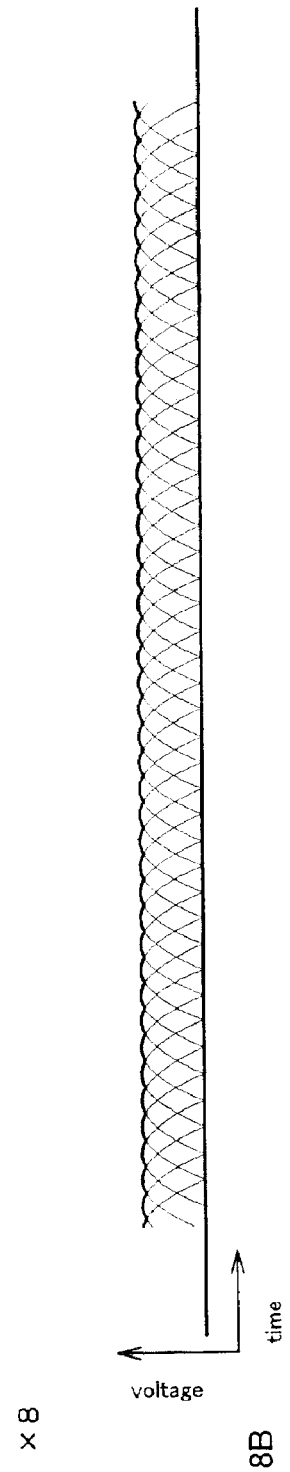
Fig. 8B ×8
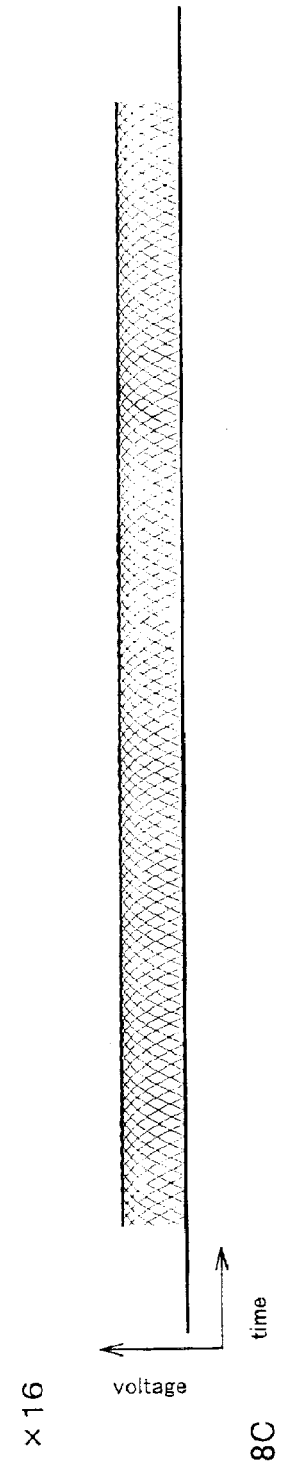
Fig. 8C ×16

MEASURING METHOD, INSPECTION METHOD, INSPECTION DEVICE, SEMICONDUCTOR DEVICE, METHOD OF MANUFACTURING A SEMICONDUCTOR DEVICE, AND METHOD OF MANUFACTURING AN ELEMENT SUBSTRATE

BACKGROUND OF THE INVENTION

1. Field of the Invention

The present invention relates to a measuring method in which a circuit or a circuit element of a semiconductor device is operated and an output from the circuit or the circuit element is read, and to a method of inspecting by using the measuring method to inspect whether a pixel portion operates normally. More particularly, the present invention relates to a non-contact type inspection method and a non-contact type inspection device using the non-contact type inspection method. The present invention also relates to a method of manufacturing a semiconductor device, which includes an inspection step using the inspection method, and to a semiconductor device manufactured by using the manufacturing method. Further, the present invention relates to a method of manufacturing an element substrate including an inspection step using the inspection method, and to an element substrate manufactured by using the manufacturing method.

2. Description of the Related Art

In recent years, attention have been paid on techniques for forming a thin-film transistor (TFT) by using a semiconductor film (having a thickness of about several nanometers to several hundred nanometers) formed on a substrate having an insulating surface. This is because the demand for active matrix semiconductor display devices included in the category of semiconductor devices has been increased. Typical examples of the active matrix semiconductor display devices include liquid crystal displays, organic light emitting diode (OLED) displays, and digital micromirror devices (DMDs).

A high degree of mobility can be achieved in TFTs in which a semiconductor film of a crystalline structure is used as an active layer (crystalline TFTs). Therefore, it is possible to realize an active matrix semiconductor display device capable of high-resolution image display by forming TFTs of such a kind with functional circuits integrated on one substrate.

An active matrix semiconductor display device is completed by performing various manufacturing processes. For example, essential processes for manufacturing an active matrix liquid crystal display are a pattern forming process for performing forming and pattern forming of a semiconductor film, a color filter forming process for realizing a color display, a cell assembly process for forming a liquid crystal panel by enclosing a liquid crystal between an element substrate having devices including a semiconductor and a counter substrate having a counter electrode, and a module assembly process for completing the liquid crystal display by attaching drive components for operating the liquid crystal panel and a backlight to the liquid crystal panel assembled in the cell assembly process.

Ordinarily, each of the above-described processes includes an inspection step though the requirements for inspection steps therein vary more or less, depending on the kind of the liquid crystal display. If a defective can be picked out in an earlier stage of the manufacturing process before it is finished as a product, execution of the subsequent processes with respect to the defective panel can be avoided. Therefore the inspection step is highly effective in reducing the manufacturing cost.

The pattern forming process includes as one of its inspection steps a defect inspection after pattern forming.

The defect inspection after pattern forming is an inspection for detecting, after pattern forming, a portion where a malfunction occurs due to variation in width of semiconductor film, insulating film and wiring pattern (hereafter, simply referred to as a pattern), or a portion where a wiring is broken or short-circuited by dust or by film forming failure, or for ascertaining whether circuit or circuit element to be inspected operates normally.

Methods for such defect inspection are generally grouped into an optical inspection method and a probe inspection method.

An optical inspection method is a method of identifying a faulty portion (defect) by reading with a CCD or the like a pattern formed on a substrate and by comparing the read pattern with a reference pattern. A probe inspection method is a method of determining whether a portion is defective or non-defective by setting fine pins (probes) on terminals on the substrate side and by measuring a current or voltage between the probes. Generally, the former is called a non-contact type inspection method and the latter is called a contact stylus type inspection method.

Although it is possible to determine whether an element substrate is defective or non-defective by using either of these inspection methods, each inspection method has both advantages and disadvantages.

The optical inspection method have a problem in that if the inspection is performed after the completion of formation of a plurality of layered patterns, it is difficult to identify each pattern in lower layers, and it is, therefore, difficult to determine whether a circuit or a circuit element is defective or non-defective by performing detection of a defective portion. To avoid this problem, the inspection may be performed each time a pattern is formed. In such a case, however, the inspection step is complicated and the time required to perform the whole manufacturing process is increased. The probe inspection methods have a problem in that when probes are set directly on wiring or probe terminals, there is a fear of the wiring or probe terminals being scratched to produce minute dust. Dust produced during the inspection step becomes a cause of an undesirable result, i.e., a reduction in yield in subsequent processes.

SUMMARY OF THE INVENTION

The present invention has been made in view of the above-described problems, and an object of the present invention is to establish a further simplified inspection method which does not require setting probes on wiring or probe terminals, and to provide an inspection device using the inspection method.

The inventors of the present invention have conceived that a current may be allowed to flow a wiring on an element substrate by causing an electromotive force to be produced in the wiring by electromagnetic induction without setting probes.

More specifically, a substrate (inspection substrate) for inspection of the element substrate is separately provided. The inspection substrate has primary coils for input (referred to as "input primary coil" or "first primary coil" in this specification) and secondary coils for output (hereinafter referred to as "output secondary coil" or "second secondary coil"). The element substrate to be inspected has secondary coils for input (hereinafter referred to as "input secondary coil" or "first secondary coil") and primary coils for output (hereinafter referred to as "output primary coil" or "second primary coil").

Each of the input primary coils, the input secondary coils, the output primary coils and output secondary coils can be formed by pattern forming a conductive film formed on a substrate. In the present invention, the coil used as each of the input primary coils, the input secondary coils, the output primary coils and output secondary coils is not a coil having a magnetic material provided at a center to form a magnetic path but a coil having no magnetic material at a center.

The input primary coils provided on the inspection substrate and the input secondary coils provided on the element substrate are superposed on each other with a certain spacing set therebetween, and an alternating current voltage (ac voltage) is applied between a pair of terminals of each of the input primary coils to generate electromotive force between a pair of terminals of the corresponding input secondary coil.

It is desirable to minimize the spacing between the input primary coils and the input secondary coils. It is preferred that the input primary coils and the input secondary coils be set closer to each other as long as the spacing therebetween can be controlled.

In this specification, an application of a voltage to a coil is equivalent to that of the voltage between the pair of terminals of the coil, and input of a signal to a coil is equivalent to the application of the voltage of the signal between the pair of terminals of the coil.

Alternating current voltages generated as the electromotive force across the input secondary coils may be rectified and smoothed appropriately in a circuit on the element substrate to obtain dc voltages used to drive the circuits or the circuit elements provided on the element substrate (referred to as "power supply voltage"). Also, the waveform of alternating current voltages generated as the electromotive force across the input secondary coils may be appropriately shaped by a waveform shaping circuit or the like to form signals having voltages used to drive the circuits or the circuit elements provided on the element substrate (referred to as "drive signal").

The drive signals or power supply voltages thus obtained are supplied to the circuits or the circuit elements formed on the element substrate. The circuits or the circuit elements operate in certain ways by the drive signals or power supply voltages. Outputs from some of the circuits or the circuit elements to be inspected are supplied to an inspection-only circuit the whole of which is provided on the element substrate.

The voltage at any point in each circuit or circuit element may be input to the inspection-only circuit as an output from the circuit or the circuit element if it enables ascertainment as to whether the circuit or the circuit element is operating normally.

The ac voltages generated as the electromotive force across the input secondary coils are also input to the inspection-only circuit. The inspection-only circuit is constituted mainly of means (1) for performing signal processing on the outputs from the inspected circuits or circuit elements to obtain signals (operation information signals) including information on the operating conditions of the inspected circuits or circuit elements, means (2) for amplifying the operation information signals, and means (3) for modulating the amplitudes of the ac voltages input to the inspection-only circuit with the amplified operation information signals and for outputting the voltage of the modulated amplitudes. In this specification, a signal having an ac voltage is referred to as "ac signal" and an ac signal in a modulated state is referred to as "modulated signal".

It is not essentially necessary to provide the means (2) for amplifying the operation information signals. In this specification, the means (3) for modulating the amplitudes of the ac voltage input to the inspection-only circuit with the amplified operation information signals and for outputting the modulated amplitudes is referred to as "modulation circuit".

Each ac modulated signal output from the inspection-only circuit is supplied to one of the pair of terminals of the corresponding one of the output primary coils provided on the element substrate. A constant voltage is applied to the other terminal of the output primary coil. The output primary coils provided on the element substrate and supplied with such a signal and voltage and the output secondary coils provided on the inspection substrate are superposed on each other with a certain spacing set therebetween, thereby generating the electromotive force between the pairs of terminals of the output secondary coils.

It is desirable to minimize the spacing between the output primary coils and the output secondary coils. It is preferred that the output primary coils and the output secondary coils be set closer to each other as long as the spacing therebetween can be controlled.

A constant voltage is applied to one of the pair of terminals of each output secondary coil. The value of the voltage at the other terminal of the output secondary coil is determined by the voltage of the modulated signal. Therefore, it is possible to ascertain whether the corresponding inspected circuit or circuit element is operating normally form the value of the voltage at the other terminal of the output secondary coil.

If the frequency of the ac voltage input to the inspection-only circuit is increased, the frequency of the modulated signals supplied from the inspection-only circuit to the terminals of the output primary coils is also increased. The impedance of each coil is determined by various factors, e.g., coil design, including the number of turns and the size of the coil, and the frequency of the signal input to the coil. Therefore, it is desirable that the frequency of the ac voltages before modulation which are input to the inspection-only circuit be determined by considering the other factors essential in determination of the coil impedance value.

Each operation information signal may have a dc component in some cases, depending on the operating condition of the corresponding inspected circuit or circuit element. Even if the operation information signal has a dc component, it is possible to produce, between the terminals of the output secondary coil, an electromotive force including information on a defective/non-defective condition by supplying the ac modulated signal formed by the modulation with the operation information signal to the. terminal of the output primary coil.

It is not always necessary to sort pixels into two groups, i.e., non-defectives and defectives in terms of operating condition. The pixels may be sorted into a plurality of ranks according to the operating condition.

It is not essentially necessary to provide the input primary coils and the output secondary coils on the same inspection substrate. The input primary coils and the output secondary coils may be respectively formed on different substrates.

Weak electromagnetic waves or electric fields generated from the circuits or the circuit elements when the circuits or the circuit elements are driven may be monitored to detect a portion not operating normally from the multiplicity of the circuits or circuit elements without using the output primary coils and the output secondary coils.

In such a case, any of various sorts of information on the electromagnetic waves or electric fields can be monitored and used. More specifically, it is possible to collect the frequency, phase, intensity, time, etc., as information on the electromagnetic wave or electric field in various dimensions. According to the present invention, any sort of information on the electromagnetic wave or electric field may be used if it enables a detection of a portion not operating normally in the multiplicity of the circuits or circuit elements.

A well-known method may be used as a method of monitoring the weak electromagnetic wave or electric field generated at each circuit or circuit element.

The above-described structures of the present invention enable the detection of defective portions and a determination of a defective/non-defective condition of each inspected circuit or circuit element without setting probes directly on wirings or terminals. The possibility of minute dust being produced by setting probes is eliminated to prevent a reduction in yield in subsequent processes. The inspection method of the present invention, unlike optical inspection methods, enables a defective/non-defective determination of all the pattern forming steps by one inspection step, thus simplifying the inspection step.

The structures of the present invention will be described in more detail below.

The present invention relates to a method of measuring a circuit or a circuit element, the method including the steps of:

operating the circuit or the circuit element by applying a voltage to the circuit or the circuit element in a non-contact manner; and reading a voltage output from the circuit or the circuit element in a non-contact manner.

The present invention may have such a feature that the operating condition of the circuit or the circuit element is inspected by using the voltage output from the circuit or the circuit element which is read by the measuring method.

The present invention also relates to a method of measuring a circuit or a circuit element, the method including the steps of:

operating the circuit or the circuit element by applying a voltage to the circuit or the circuit element in a non-contact manner;

forming a modulated signal by modulating an ac voltage with a voltage output from the circuit or the circuit element; and reading the voltage of the modulated signal in a non-contact manner.

The present invention may have such a feature that the operating condition of the circuit or the circuit element is inspected by using the voltage of the modulated signal read by the measuring method.

The present invention also relates to a method of inspecting a circuit or a circuit element, the method including the steps of:

operating the circuit or the circuit element by applying a voltage to the circuit or the circuit element in a non-contact manner;

reading a voltage output from the circuit or the circuit element in a non-contact manner; and inspecting the operating condition of the circuit or the circuit element.

The present invention also relates to a method of inspecting a circuit or a circuit element, the method including the steps of:

operating the circuit or the circuit element by applying a voltage to the circuit or the circuit element in a non-contact manner;

forming a modulated signal by modulating an ac voltage with a voltage output from the circuit or the circuit element;

reading the voltage of the modulated signal in a non-contact manner; and inspecting the operating condition of the circuit or the circuit element.

The present invention also relates to a method of inspecting a circuit or a circuit element, the method including the steps of:

applying a first ac voltage between a pair of terminals of a first coil;

overlapping the first coil and a second coil with a certain spacing set therebetween;

forming a signal for operating the circuit or the circuit element from a second ac voltage generated between a pair of terminals of the second coil;

operating the circuit or the circuit element by inputting the signal to the circuit or the circuit element;

forming a modulated signal by modulating a third ac voltage with a voltage output from the circuit or the circuit element;

applying the voltage of the modulated signal between a pair of terminals of a third coil;

overlapping the third coil and a fourth coil with a certain spacing set therebetween; and inspecting the operating condition of the circuit or the circuit element through a fourth ac voltage generated between a pair of terminals of the fourth coil.

The present invention also relates to a method of inspecting a circuit or a circuit element, the method including the steps of:

applying a first ac voltage between a pair of terminals of a first coil;

overlapping the first coil and a second coil with a certain spacing set therebetween;

operating the circuit or the circuit element by rectifying a second ac voltage generated between a pair of terminals of the second coil or shaping the waveform of the voltage to be applied to the circuit or the circuit element;

forming a modulated signal by modulating a third ac voltage with a voltage output from the circuit or the circuit element;

applying the voltage of the modulated signal between a pair of terminals of a third coil;

overlapping the third coil and a fourth coil with a certain spacing set therebetween; and inspecting the operating condition of the circuit or the circuit element through a fourth ac voltage generated between a pair of terminals of the fourth coil.

The present invention may have such a feature that the frequency of the third ac voltage is higher than the frequency of the first ac voltage.

The present invention also relates to a method of inspecting a circuit or a circuit element, the method including the steps of:

generating ac voltages differing in phase between pairs of terminals of a plurality of second coils by applying first ac voltages differing in phase between pairs of terminals of a plurality of first coils and by overlapping the plurality of first coils and the plurality of second coils with a certain spacing set therebetween;

generating a dc voltage by rectifying the ac voltages generated between the pairs of terminals of the plurality of second coils, which differ from each other in phase and by adding together the rectified ac voltages;

generating an ac voltage between a pair of terminals of a fourth coil by applying a second ac voltage between a pair of terminals of a third coil and by overlapping the third coil and the fourth coil with a certain spacing set therebetween;

modulating the ac voltage generated between the pair of terminals of the fourth coil with a voltage output from the circuit or the circuit element, by applying the dc voltage to the circuit or the circuit element;

generating an ac voltage between a pair of terminals of a sixth coil by applying the modulated ac voltage between a pair of terminals of a fifth coil and by overlapping the fifth coil and the sixth coil with a certain spacing set therebetween; and inspecting the operating condition of the circuit or the circuit element through the ac voltage generated across the sixth coil.

The present invention may have such a feature that the plurality of first coils, the third coil and the sixth coil are formed on a first insulating surface, and the circuit or the circuit element, the plurality of second coils, the fourth coil and the fifth coil are formed on a second insulating surface.

The present invention may have such a feature that the frequency of the second ac voltage is higher than the frequency of the first ac voltage.

The present invention may have such a feature that the plurality of first coils, the plurality of second coils, the third coil, the fourth coil, the fifth coil and the sixth coil have their wirings formed along one plane, the wirings having a spiral shape.

The present invention also relates to a method of inspecting a circuit or a circuit element, the method including the steps of:

generating ac voltages differing in phase between pairs of terminals of a plurality of second coils by applying first ac voltages differing in phase between pairs of terminals of a plurality of first coils and by overlapping the plurality of first coils and the plurality of second coils with a certain spacing set therebetween;

generating a dc voltage by rectifying the ac voltages generated between the pairs of terminals of the plurality of second coils, which differ from each other in phase and by adding together the rectified ac voltages;

generating an ac voltage between a pair of terminals of a fourth coil by applying a second ac voltage between a pair of terminals of a third coil and by overlapping the third coil and the fourth coil with a certain spacing set therebetween;

generating a voltage for driving the circuit or the circuit element by shaping the waveform of the ac voltage generated between the pair of terminals of the fourth coil;

generating an ac voltage between a pair of terminals of a sixth coil by applying a third ac voltage between a pair of terminals of a fifth coil and by overlapping the fifth coil and the sixth coil with a certain spacing set therebetween;

modulating the ac voltage generated between the pair of terminals of the sixth coil with a voltage output from the circuit or the circuit element, by applying the dc voltage and the voltage for driving the circuit or the-circuit element to the circuit or the circuit element;

generating an ac voltage between a pair of terminals of an eighth coil by applying the modulated ac voltage between a pair of terminals of a seventh coil and by overlapping the seventh coil and the eighth coil with a certain spacing set therebetween; and inspecting the operating condition of the circuit or the circuit element through the ac voltage generated across the eighth coil.

The present invention may have such a feature that the plurality of first coils, the third coil, the fifth coil and the eighth coil are formed on a first insulating surface, and the circuit or the circuit element, the plurality of second coils, the fourth coil, the sixth coil and the seventh coil are formed on a second insulating surface.

The present invention may have such a feature that the frequency of the third ac voltage is higher than the frequency of the first ac voltage or the second ac voltage.

The present invention may have such a feature that the plurality of first coils, the plurality of second coils, the third coil, the fourth coil, the fifth coil, the sixth coil, the seventh coil and the eighth coil have their wirings formed along one plane, the wirings having a spiral shape.

The present invention also relates to a method of inspecting a circuit or a circuit element, the method including the steps of:

generating an ac voltage between a pair of terminals of a second coil by applying a first ac voltage between a pair of terminals of a first coil and by overlapping the first coil and the second coil with a certain spacing set therebetween;

generating a voltage for driving the circuit or the circuit element by shaping the waveform of the ac voltage generated between the pair of terminals of the second coil;

generating an ac voltage between a pair of terminals of a fourth coil by applying a second ac voltage between a pair of terminals of a third coil and by overlapping the third coil and the fourth coil with a certain spacing set therebetween;

modulating the ac voltage generated between the pair of terminals of the fourth coil with a voltage output from the circuit or the circuit element, by applying the voltage for driving the circuit or the circuit element to the circuit or the circuit element;

generating an ac voltage between a pair of terminals of a sixth coil by applying the modulated ac voltage between a pair of terminals of a fifth coil and by overlapping the fifth coil and the sixth coil with a certain spacing set therebetween; and inspecting the operating condition of the circuit or the circuit element through the ac voltage generated across the sixth coil.

The present invention may have such a feature that the first coil, the third coil and the sixth coil are formed on a first insulating surface, and the circuit or the circuit element, the second coil, the fourth coil and the fifth coil are formed on a second insulating surface.

The present invention may have such a feature that the frequency of the second ac voltage is higher than the frequency of the first ac voltage.

The present invention may have such a feature that the first coil, the second coil, the third coil, the fourth coil, the fifth coil and the sixth coil have their wirings formed along one plane, the wirings having a spiral shape.

The present invention may have such a feature that the distance between the first insulating surface and the second insulating surface is controlled by causing a fluid to flow between the first insulating surface and the second insulating surface.

The present invention also relates to a device for inspecting a circuit or a circuit element provided on an element substrate, the device having:

a first primary coil;

a second secondary coil;

means for overlapping the first primary coil and a first secondary coil provided on the element substrate, with a certain spacing set between the first primary coil and the first secondary coil;

means for overlapping the second secondary coil and a second primary coil provided on the element substrate, with a certain spacing set between the second secondary coil and the second primary coil;

means for applying an ac voltage between a pair of terminals of the first primary coil; and means for inspecting the operating condition of the circuit or the circuit element through an ac voltage generated between a pair of terminals of the second secondary coil.

The present invention also relates to a device for inspecting a circuit or a circuit element provided on an element substrate, the device having:

a first primary coil;

a second secondary coil;

means for overlapping the first primary coil and a first secondary coil provided on the element substrate, with a certain spacing set between the first primary coil and the first secondary coil;

means for overlapping the second secondary coil and a second primary coil provided on the element substrate, with a certain spacing set between the second secondary coil and the second primary coil;

means for applying an ac voltage between a pair of terminals of the first primary coil;

means for amplifying or buffer-amplifying an ac voltage generated between a pair of terminals of the second secondary coil; and means for inspecting the operating condition of the circuit or the circuit element through the ac voltage amplified or buffered and amplified.

The present invention also relates to a device for inspecting a circuit or a circuit element provided on an element substrate, the device having:

a first primary coil;

a second secondary coil;

means for overlapping the first primary coil and a first secondary coil provided on the element substrate, with a certain spacing set between the first primary coil and the first secondary coil;

means for overlapping the second secondary coil and a second primary coil provided on the element substrate, with a certain spacing set between the second secondary coil and the second primary coil;

means for applying an ac voltage between a pair of terminals of the first primary coil; and means for inspecting the operating condition of the circuit or the circuit element through an ac voltage generated between a pair of terminals of the second secondary coil, wherein the ac voltage generated between the pair of terminals of the second secondary coil includes information on the operating condition of the circuit or the circuit element or the location of a defective portion.

The present invention further relates to a device for inspecting a circuit or a circuit element provided on an element substrate, the device having:

a first primary coil;

a second secondary coil;

means for overlapping the first primary coil and a first secondary coil provided on the element substrate, with a certain spacing set between the first primary coil and the first secondary coil;

means for overlapping the second secondary coil and a second primary coil provided on the element substrate, with a certain spacing set between the second secondary coil and the second primary coil;

means for applying an ac voltage between a pair of terminals of the first primary coil;

means for amplifying or buffer-amplifying an ac voltage generated between a pair of terminals of the second secondary coil; and means for inspecting the operating condition of the circuit or the circuit element through the ac voltage amplified or buffered and amplified, wherein the ac voltage amplified or buffered and amplified includes information on the operating condition of the circuit or the circuit element or the location of a defective portion.

The present invention may have such a feature that the distance between the first primary coil and the first secondary coil is controlled by causing a fluid to flow between the first primary coil and the first secondary coil.

The present invention may have such a feature that the distance between the second primary coil and the second secondary coil is controlled by causing a fluid to flow between the second primary coil and the second secondary coil.

The present invention may have such a feature that the first primary coil has its wiring formed along one plane, the wiring having a spiral shape.

The present invention may have such a feature that the second secondary coil may have its wiring formed along one plane, the wiring having a spiral shape.

The present invention also relates to a method of manufacturing a semiconductor device, the method including the steps of:

manufacturing a circuit or a circuit element;

operating the circuit or the circuit element after manufacture by applying a voltage to the circuit or the circuit element in a non-contact manner;

reading a voltage output from the circuit or the circuit element in a non-contact manner; and inspecting the operating condition of the circuit or the circuit element.

The present invention also relates to a method of manufacturing a semiconductor device, the method including the steps of:

manufacturing a circuit or a circuit element;

operating the circuit or the circuit element after manufacture by applying a voltage to the circuit or the circuit element in a non-contact manner;

forming a modulated signal by modulating an ac voltage with a voltage output from the circuit or the circuit element;

reading the voltage of the modulated signal in a non-contact manner; and inspecting the operating condition of the circuit or the circuit element.

The present invention also relates a method of manufacturing a semiconductor device, the method including the steps of:

manufacturing a circuit or a circuit element, a first coil, a second coil, a third coil. and a fourth coil;

applying a first ac voltage between a pair of terminals of the first coil after manufacture;

overlapping the first coil and the second coil with a certain spacing set therebetween;

forming a signal for operating the circuit or the circuit element from a second ac voltage generated between a pair of terminals of the second coil;

operating the circuit or the circuit element by inputting the signal to the circuit or the circuit element;

forming a modulated signal by modulating a third ac voltage with a voltage output from the circuit or the circuit element;

applying the voltage of the modulated signal between a pair of terminals of the third coil;

overlapping the third coil and the fourth coil with a certain spacing set therebetween; and inspecting the operating condition of the circuit or the circuit element through a fourth ac voltage generated between a pair of terminals of the fourth coil.

The present invention also relates to a semiconductor device having a circuit or a circuit element, means for applying a voltage to the circuit or the circuit element in a non-contact manner, means for forming a modulated signal by modulating an ac voltage with a voltage output from the circuit or the circuit element, and means for outputting the voltage of the modulated signal in a non-contact manner.

The present invention also relates to a semiconductor device having:

a circuit or a circuit element;

means for applying a voltage to the circuit or the circuit element in a non-contact manner by using a first coil;

means for forming a modulated signal by modulating an ac voltage with a voltage output from the circuit or the circuit element; and means for outputting the voltage of the modulated signal in a non-contact manner by using a second coil.

The present invention also relates to a semiconductor device having:

a circuit or a circuit element;

a first coil;

a second coil;

a third coil;

means for rectifying a first ac voltage generated between a pair of terminals of the first coil or shaping the waveform of the voltage, for the application to the circuit or the circuit element; and means for forming a modulated signal by modulating a second ac voltage generated between a pair of terminals of the second coil with a voltage output from the circuit or the circuit element, and for applying the modulated signal between a pair of terminals of the third coil.

The present invention also relates to a semiconductor device having:

a circuit or a circuit element;

a plurality of first coils;

a second coil;

a third coil;

means for generating a dc voltage by rectifying first ac voltages generated between pairs of terminals of the plurality of first coils and by adding together the rectified voltages, and for applying the generated dc voltage to the circuit or the circuit element; and means for forming a modulated signal by modulating a second ac voltage generated between a pair of terminals of the second coil with a voltage output from the circuit or the circuit element, and for applying the modulated signal between a pair of terminals of the third coil.

The present invention also relates to a semiconductor device having:

a circuit or a circuit element;

a first coil;

a plurality of second coils;

a third coil;

a fourth coil;

means for rectifying a first ac voltage generated between a pair of terminals of the first coil or shaping the waveform of the voltage, for the application to the circuit or the circuit element;

means for generating a dc voltage by rectifying second ac voltages generated between pairs of terminals of the plurality of second coils and by adding together the rectified voltages, and for applying the generated dc voltage to the circuit or the circuit element; and means for forming a modulated signal by modulating a third ac voltage generated between a pair of terminals of the third coil with a voltage output from the circuit or the circuit element, and for applying the modulated signal between a pair of terminals of the fourth coil.

BRIEF DESCRIPTION OF THE DRAWINGS

In the accompanying drawings:

FIGS. 7A and 7B are diagrams showing changes with time in a signal obtained as a pulsating current by rectification of an ac current;

FIGS. 8A, 8B, and 8C are diagrams showing changes with time in a dc signal obtained by the addition of pulsating currents;

DESCRIPTION OF THE PREFERRED EMBODIMENTS

Figure 1A:
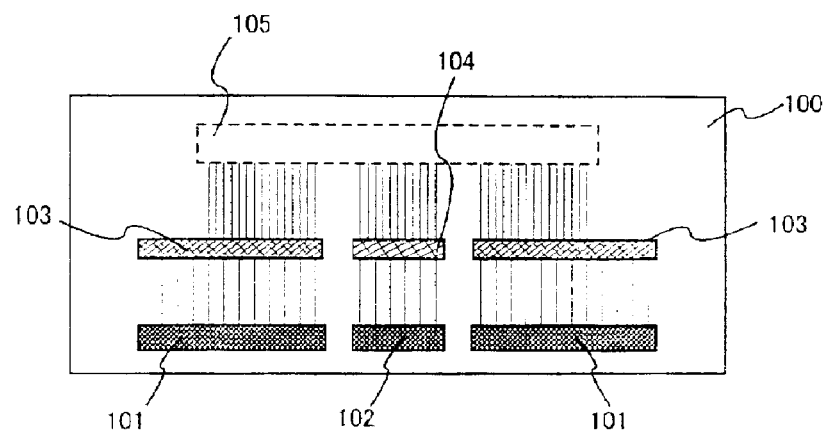
FIGS. 1A and 1B are top views of an inspection substrate and an element substrate.
Figure 1B:
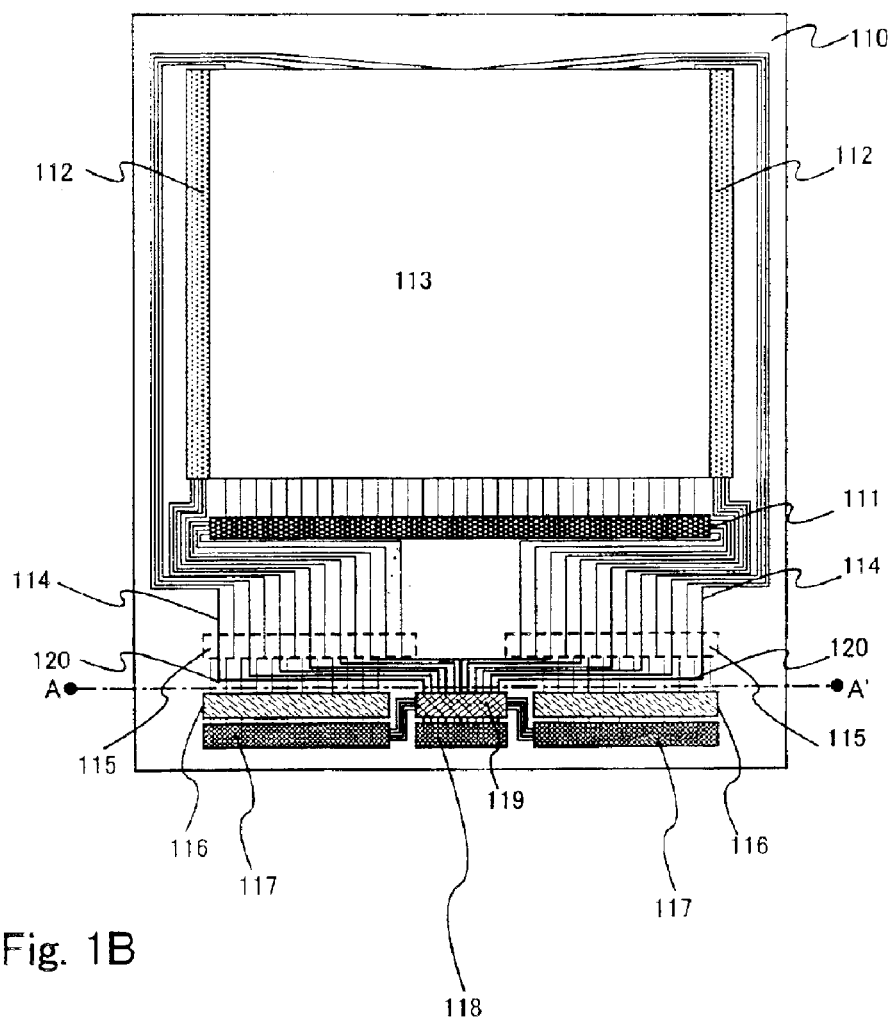

FIG. 1A is a top view of an inspection substrate used to perform inspection in accordance with the present invention, and FIG. 1B is a top view of an element substrate to be inspected. In an embodiment of the present invention, an inspection method will be described with respect to inspection of an element substrate of a liquid crystal display as an example. However, use of the inspection method of the present invention is not limited to inspection of a liquid crystal display. The inspection method of the present invention can be used to inspect any semiconductor device formed by using a semiconductor.

The inspection substrate shown in FIG. 1A has a substrate 100 on which are formed an input primary coil formation portion 101, an output secondary coil formation portion 102, an external input buffer 103, an external output buffer 104, and a connector connection portion 105. The inspection substrate of this specification includes the substrate 100 and all circuits or circuit elements formed on the substrate 100.

The number of input primary coil formation portions 101, the number of output secondary coil formation portions 102, and the layout of input primary coil formation portions 101 and output secondary coil formation portions 102 provided on the inspection substrate are not limited to those in FIG. 1A. The number of input primary coil formation portions 101, the number of output secondary coil formation portions 102, and the layout of input primary coil formation portions 101 and output secondary coil formation portions 102 can be freely set by a designer.

The element substrate shown in FIG. 1B has a substrate 110 on which are provided a signal line drive circuit 111, a scanning line drive circuit 112, a pixel portion 113, routing wiring 114, a connector connection portion 115, a waveform shaping or rectifier circuit 116, an input secondary coil formation portion 117, an output primary coil formation portion 118, an inspection-only circuit 119, and coil wiring 120. The element substrate of this specification includes the substrate 110 and all circuits or circuit elements formed on the substrate 110. The routing wiring 114 is wiring for supplying drive signals and power supply voltages to the pixel portion and the drive circuits provided on the element substrate.

The number of input secondary coil formation portions 117, the number of output primary coil formation portions 118, and the layout of input secondary coil formation portions 117 and output primary coil formation portions 118 provided on the element substrate are not limited to those in FIG. 1B. The number of input secondary coil formation portions 117, the number of output primary coil formation portions 118, and the layout of input secondary coil formation portions 117 and output primary coil formation portions 118 can be freely set by the designer.

A flexible printed circuit (FPC), tape automated bonding (TAB) conductors, or the like are connected to the connector connection portion 115 in a process following the inspection step. After inspection, the element substrate is cut along a line represented by a dotted line A–A' so that the coil wiring 120 is cut off physically and electrically.

The operation of the element substrate and the inspection substrate in an inspection step will next be described. For ease of understanding of the flows of signals in the inspection step, the structures of the circuits of the element substrate and the inspection substrate shown in FIG. 1 are shown in the block diagram of FIG. 2. The operation will be described with reference to FIGS. 1 and 2.

On the inspection substrate 204, an alternating current signal used for the inspection is input to the external input buffer 103 from a signal source 201 or an alternating current power supply 202 via a connector connected to the connector connection portion 105. The inspection ac signal is buffered and amplified by the external input buffer 103 is thereafter input to the input primary coil formation portion 101.

Figure 2:
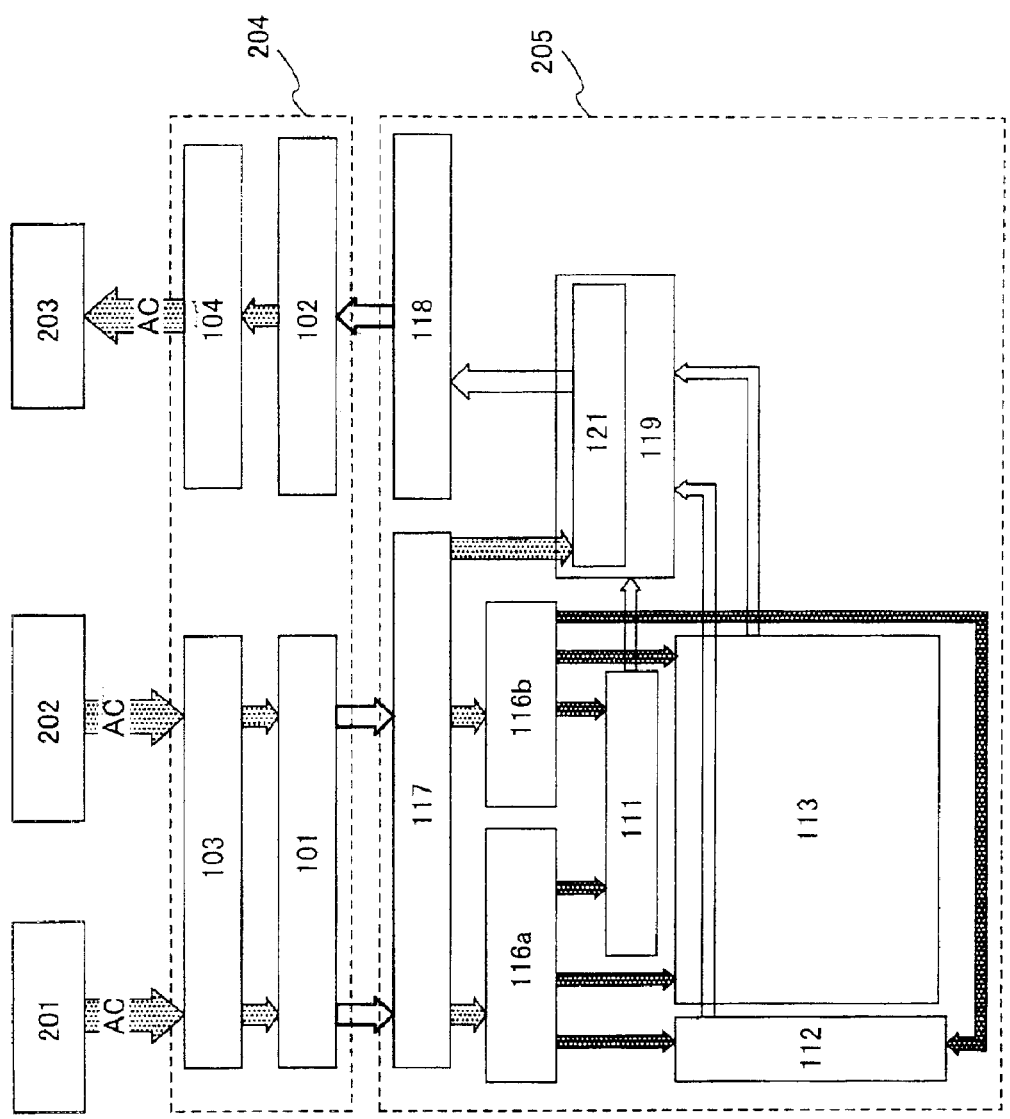
FIG. 2 is a block diagram of the inspection substrate and the element substrate.

In FIGS. 1 and 2, the input ac signal is input to the input primary coil formation portion 101 after being buffered and amplified by the external input buffer 103. The present invention, however, is not limited to this arrangement. An ac signal may be input directly to the input primary coil formation portion 101 without providing the external input buffer 103.

A plurality of input primary coils are formed in the input primary coil formation portion 101. The ac signal is applied between a pair of terminals of each input primary coil.

On the other hand, a plurality of input secondary coils corresponding to the plurality of input primary coils of the input primary coil formation portion 101 are formed in the input secondary coil formation portion 117 of the element substrate 205. When the ac signal is applied to the input primary coils, an ac voltage is generated as electromotive force between the a pair of terminals of each of the input secondary coils by electromagnetic induction.

The ac voltage generated in each input secondary coil is supplied to the waveform shaping circuit 116a or the rectifier circuit 116b. The waveform shaping circuit 116a or the rectifier circuit 116b shapes or rectifies the ac voltage waveform to produce drive signals or power supply voltages.

The produced drive signals or power supply voltages are input to the routing wiring 114 through the coil wiring 120. The input drive signals, the power supply voltages, or the like are supplied to the signal line drive circuit 111, the scanning line drive circuit 112, and the pixel portion 113.

The pixel portion 113 has a plurality of pixels. A pixel electrode is formed in each pixel. The number of signal line drive circuits and the number of scanning line drive circuits are not limited to those shown in FIG. 1A and FIG. 2.

An output from each of the circuits or each of the circuit elements included in the signal line drive circuit 111, the scanning line drive circuit 112, and the pixel portion 113 is input to the inspection-only circuit 119.

For example, the voltage of each terminal of a transistor or the voltage of each pixel electrode in the pixel portion 113 may be input as an output from a circuit or a circuit element to the inspection-only circuit 119. However, it is not essentially necessary to input the outputs from the circuits or circuit elements in all the pixels to the inspection-only circuit 119. Only the outputs from the circuits or circuit elements in some of the pixels selected as desired may be input to the inspection-only circuit 119. Also, pixels only for inspection (dummy pixels), that are not actually used for display, may be provided in the pixel portion 113 and the output from the circuit or the circuit element in each of the pixels only for inspection is input to the inspection-only circuit 119. The above is not limited to the pixel portion 113. That is, it is not essentially necessary to input the outputs from all the circuits or the circuit elements on the element substrate to the inspection-only circuit 119, and only the outputs from some of the circuits or the circuit elements on the element substrate selected as desired may be input to the inspection-only circuit 119. Further, circuits or circuit elements only for inspection, that are not actually used for driving, may be formed and the output from each of the circuits or circuit elements only for inspection may be input to the inspection-only circuit 119.

The inspection-only circuit 119 performs signal processing for the input signal, i.e., the output from each of the input circuits or circuit element, to produce a signal (operation information signal) including information on the operating condition of the inspected circuit or circuit element. The inspection-only circuit 119 amplifies the operation information signal and inputs the amplified signal to a modulation circuit 121. It is not always necessary to amplify the operation information signal. If the operation information signal is not amplified, it is input directly to the modulation circuit 121.

On the other hand, the ac voltage generated in each input secondary coil is input to the inspection-only circuit 119. This signal of the ac voltage is input to the modulation circuit 121 provided in the inspection-only circuit 119.

Then the inspection-only circuit 119 modulates the amplitude of the input ac voltage in the modulation circuit 121 in accordance with the input operation information signal and inputs the modulated signal to the output primary coil formation portion 118.

More specifically, the voltage of the modulated signal input to the output primary coil formation portion 118 is input to one of the terminals of the plurality of output primary coils included in the output primary coil formation portion 118. A constant voltage is applied to the other terminal of the output primary coil.

On the other hand, a plurality of output secondary coils corresponding to the plurality of output primary coils of the output primary coil formation portion 118 are formed in the output secondary coil formation portion 102 of the inspection substrate 204. When the ac voltage is applied between the a pair of terminals of the output primary coil, an ac voltage is generated as electromotive force between a pair of terminals of each output secondary coils by electromagnetic induction. The ac voltage generated between the a pair of terminals of the output secondary coils includes information on the operating condition of the circuit or the circuit element.

A constant voltage is applied to one of a pair of terminals of the output secondary coil. The voltage in the other terminal of the output secondary coil is amplified by the external output buffer 104 and then input to an inspection section 203.

It is not essentially necessary to provide the external output buffer 104. The voltage in the other terminal of the output secondary coil may be input directly to the inspection section 203 without being amplified.

The inspection section 203 is capable of determining whether each circuit or circuit element is defective or non-defective from the ac voltage including information on the operation condition of the circuit or the circuit element and is capable of locating a defective portion.

Note that, if the frequency of the ac voltage input to the inspection-only circuit is increased, the frequency of the modulated signal supplied from the inspection-only circuit to the terminal of the output primary coil is also increased. The impedance of the coil is determined by various factors, e.g., coil design factors, including the number of turns and the size of the coil, and the frequency of the signal input to the coil. Therefore it is desirable that the value of the frequency of the ac voltage before modulation input to the inspection-only circuit be determined by considering the other factors that influence the determination of the coil impedance value.

The operation information signal may have a dc component, depending on the operating condition of the inspected circuit or circuit element. Even if the operation information signal has a dc component, it is possible to produce, between the terminals of the output secondary coil, electromotive force including information on a defective/ nondefective condition by supplying the ac modulated signal formed by modulation with the operation information signal to the terminal of the output primary coil.

It is not essentially necessary to provide the input primary coils and the output secondary coils on the same inspection substrate. The input primary coils and the output secondary coils may be respectively formed on different substrates.

In FIGS. 1A, 1B, and 2, the input primary coil formation portion where a plurality of input primary coil are formed and the output secondary coil formation portion where a plurality of output secondary coils are formed are defined separately from each other. The inspection substrate of the present invention, however, is not limited to this arrangement A plurality of input primary coils and a plurality of output secondary coils may be mixedly placed. In such a case, it is not necessary to separately define a region where the plurality of input primary coils are formed and a region where the plurality of output secondary coils are formed.

When the drive signals, the power supply voltages, or the like are input to the signal line drive circuit 111, the scanning line drive circuit 112, and the pixel portion 113, electromagnetic waves or electric fields are generated at the circuits or circuit elements in the signal line drive circuit 111, the scanning line drive circuit 112, and the pixel portion 113. Weak electromagnetic waves or electric fields generated from the circuits or circuit elements when the circuits or circuit elements are driven may be monitored to detect a portion not operating normally from the multiplicity of circuits or circuits or circuit elements without using the output primary coils and the output secondary coils provided as described above.

The intensity of the electric field or electromagnetic wave generated at one of the circuits or circuit elements not operating normally differs from that of the electric fields or electromagnetic waves generated at the circuits or circuit elements operating normally. Therefore the inspection section 203 may monitor the intensities of electromagnetic waves or electric fields generated at the circuits or circuit elements to determine whether each circuit or circuit element is operating normally or to locate a defective portion.

In a case where the output primary coils and the output secondary coils are not provided, the outputs from the inspection-only circuit 119 are input to predetermined terminals (pads) in FIG. 2, the intensities of electric fields or electromagnetic waves at the pads are measured and the measured values are input to the inspection section 203, thereby enabling the inspection section 203 to determine whether each inspected portion is defective or non-defective or to locate a defective portion.

Any method of monitoring electromagnetic waves or electric fields may be used if it ensures sensitivity high enough to enable determination as to whether each circuit or circuit element is operating normally.

The structure of the input primary coils, input secondary coils, output primary coils, and output secondary coils (hereinafter referred to as "coils" collectively) will be described in detail.

Figure 3A:
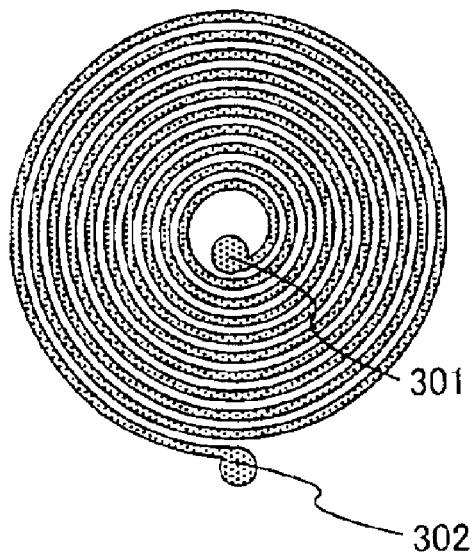
FIGS. 3A and 3B are enlarged views of coils.
Figure 3B:
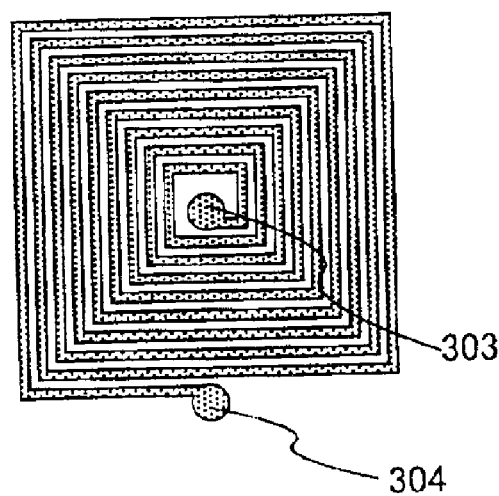

FIGS. 3A and 3B are enlarged views of coils. The coil shown in FIG. 3A is formed by spirally winding a conductor and has two ends formed as coil terminals 301 and 302. The coil shown in FIG. 3B is formed by winding a conductor so as to have a rectangular shape, and has two ends formed as coil terminals 303 and 304.

A coil entirely formed along one plane by being wound about a point may suffice as the coil used in the present invention. Therefore the conductor of the coil may be in either of a curved form or an angular form as viewed in a direction perpendicular to the plane along which the coil is formed.

The number of turns of the coils, the width of the conductor of the coils and the area occupied by the coils on the substrate may be set as appropriate by the designer.

Figure 4A:
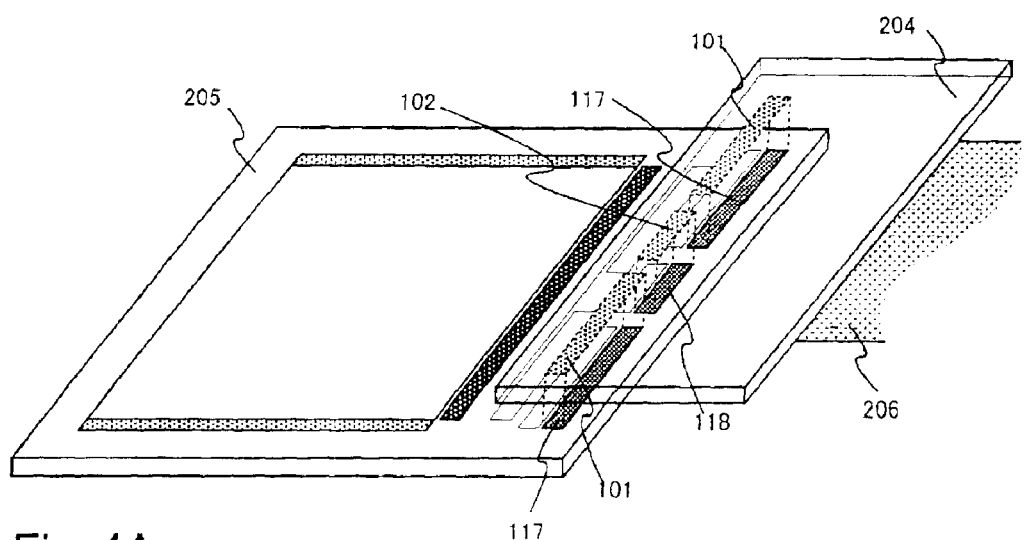
FIGS. 4A and 4B are perspective views of the inspection substrate and the element substrate at the time of inspection.

FIG. 4A shows a state in which the element substrate and the inspection substrate are placed so as to have their portions superposed on each other. In the example of structure of the coils illustrated in FIG. 4A, the element substrate shown in FIG. 1B and FIG. 2 has input secondary coils and output primary coils each formed as shown in FIG. 3A, and the inspection substrate shown in FIG. 1A and FIG. 2 has input primary coils and output secondary coils each formed as shown in FIG. 3A. A connector 206 is provided which connects the inspection substrate 204, the signal source, the ac power supply and the inspection section.

As shown in FIG. 4A, the input primary coil formation portion 101 of the inspection substrate 204 and the input secondary coil formation portion 117 of the element substrate 205 are superposed in a state of being spaced a certain distance apart from each other. It is desirable to minimize this distance. It is preferred that the input primary coil formation portion 101 and the input secondary coil formation portion 117 of the element substrate 205 be set closer to each other as long as the distance therebetween can be controlled.

Also, the output secondary coil formation portion 102 of the inspection substrate 204 and the output primary coil formation portion 118 of the element substrate 205 are superposed in a state of being spaced a certain distance apart from each other. It is desirable to minimize this distance. It is preferred that the output secondary coil formation portion 102 and the output primary coil formation portion 118 be set closer to each other as long as the distance therebetween can be controlled.

The distance between the inspection substrate 204 and the element substrate 205 may be maintained by fixing the two substrates. Also, the distance between the inspection substrate 204 and the element substrate 205 may be maintained in such a manner that one of the inspection substrate 204 and the element substrate 205 is fixed and a fluid is caused to flow through the gap between the inspection substrate 204 and the element substrate 205 at a certain flow rate or is kept at a certain pressure in the gap between the inspection substrate 204 and the element substrate 205. The fluid used for this purpose is typically a gas or a liquid. A viscous fluid such as a gel may also be used.

Figure 4B:
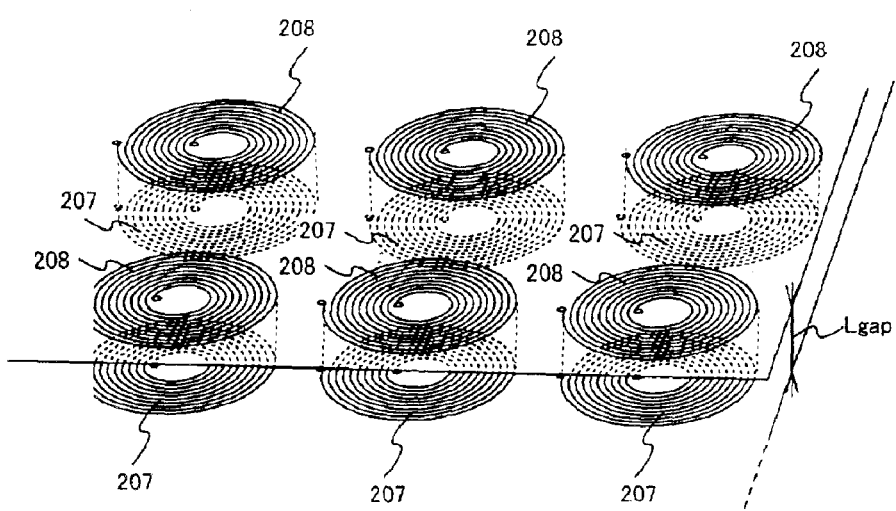

FIG. 4B is an enlarged diagram of superposed portions of the input primary coil formation portion 101 and the input secondary coil formation portion 117. Input primary coils are indicated by 208 and input secondary coils are indicated by 207.

The input primary coils 208 and the input secondary coils 207 are wound in the same direction. However, the present invention is not limited to this arrangement. The primary and secondary coils may be wound in opposite directions.

The distance ($L_{gap}$) between the primary and secondary coils is set as appropriate by the designer.

The output primary coils in the output primary coil formation portion 118 and the output secondary coils in the output secondary coil formation portion 102 are superposed on each other to be electromagnetically coupled, as are the input primary coils 208 and the input secondary coils 207 shown in FIG. 4B.

The structure of the waveform shaping circuit 116a shown in FIG. 2 will be described in detail.

Figure 5:
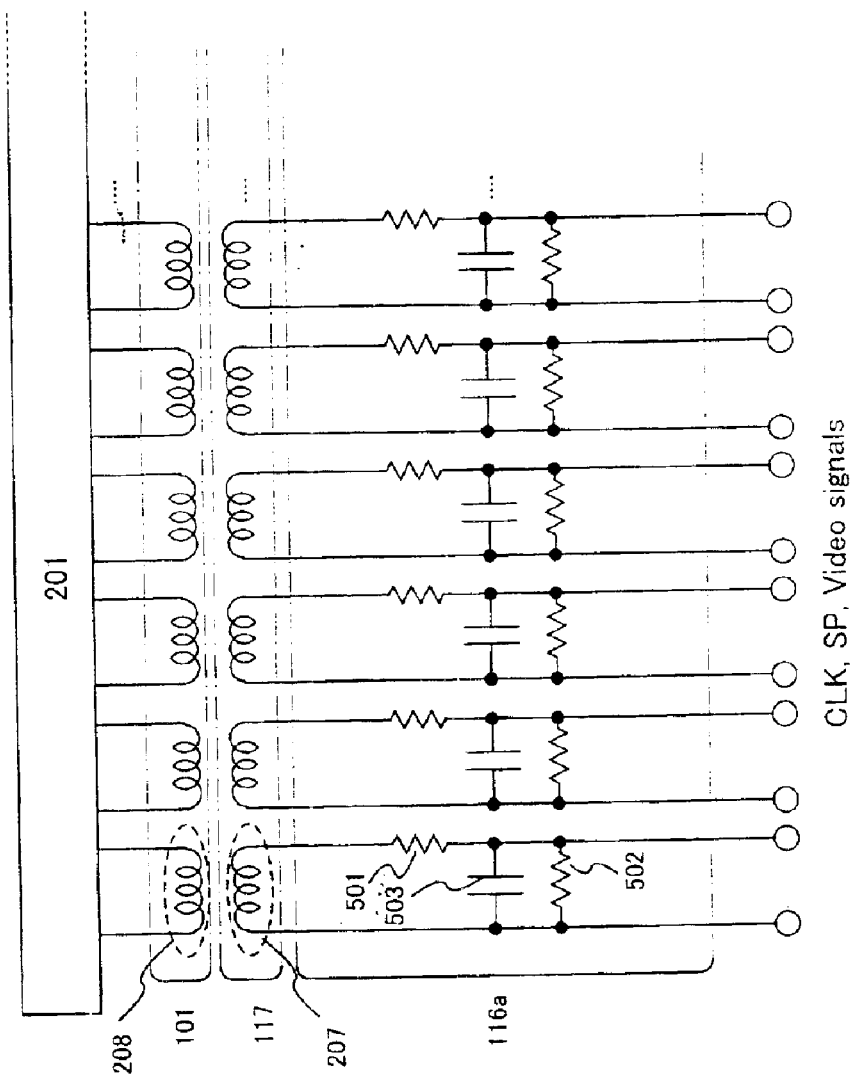
FIG. 5 is a circuit diagram of a waveform shaping circuit.

FIG. 5 shows a connecting state between the signal source 201, the input primary coil formation portion 101, the input secondary coil formation portion 117, and the waveform shaping circuit 116a shown in FIGS. 1A, 1B, and 2. A plurality of input primary coils 208 are provided in the input primary coil formation portion 101. A plurality of input secondary coils 207 are provided in the input secondary coil formation portion 117.

The inspection ac signal supplied from the signal source 201 is input to each input primary coil 208. More specifically, the voltage of the inspection ac signal from the signal source 201 is applied between the a pair of terminals of each input primary coil 208. When the ac signal is input to the input primary coil 208, an ac voltage is generated as electromotive force across the corresponding input secondary coil 207 and is applied to the waveform shaping circuit 116a.

The waveform shaping circuit 116a is an electronic circuit used to form or shape a waveform of a quantity which changes with time, e.g., a voltage or a current. Referring to FIG. 5, the waveform shaping circuit 116a has resistors 501 and 502 and capacitors 503. These circuit elements are combined to form the integrating-type waveform shaping circuit 116a. Needless to say, the waveform shaping circuit is not limited to the structure shown in FIG. 5. To perform waveform shaping, the waveform shaping circuit may use a wave-detection circuit using diodes, such as that used in the power supply circuit.

The waveform shaping circuit 116a used in the present invention generates, specifically, a clock signal (CLK), a start pulse signal (SP), and a video signal from the input ac electromotive force, and outputs these signals.

The waveform shaping circuit 116a can generate signals having any other waveforms as well as those mentioned above. Signals enabling confirmation of the operating condition of the circuits or the circuit elements may suffice as signals formed by the waveform shaping circuit 116a.

The signals output from the waveform shaping circuit 116a are input to circuits in subsequent stages signal line drive circuit 111, scanning line drive circuit 112, and pixel portion 113 in FIGS. 1 and 2).

The structure of the rectifier circuit 116b shown in FIG. 2 will be described in detail.

Figure 6:
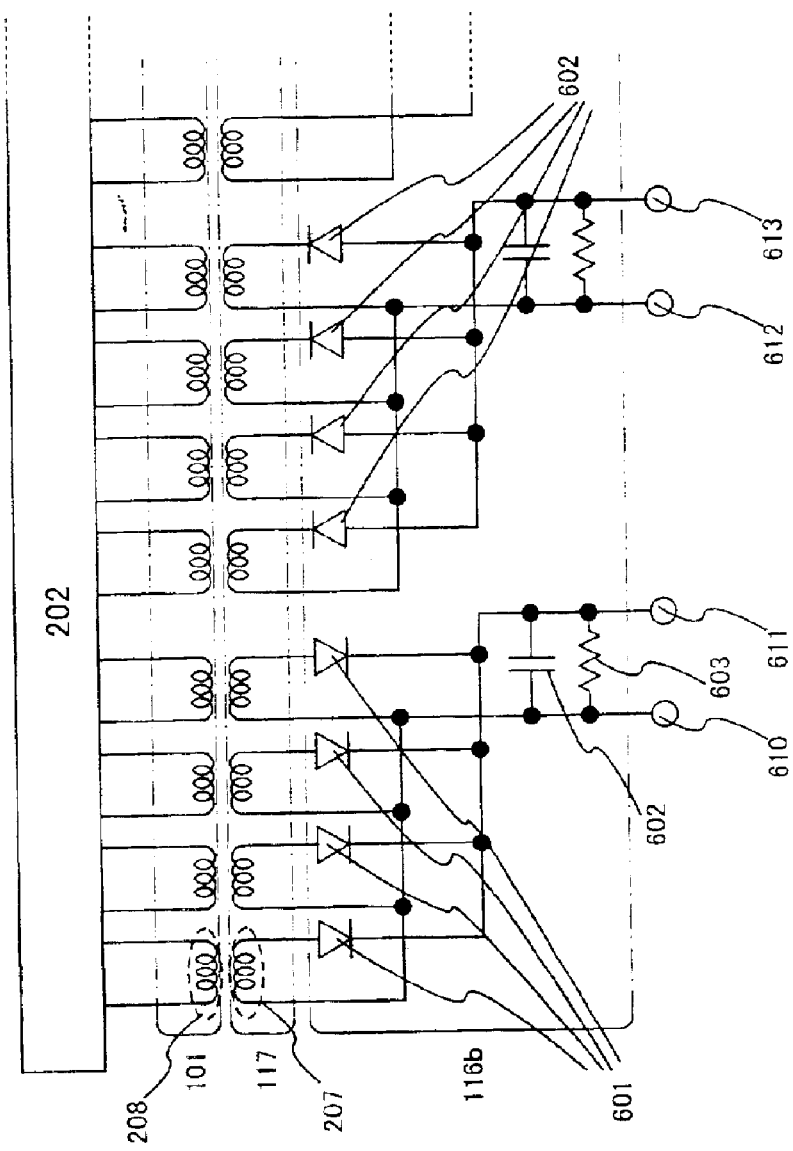
FIG. 6 is a circuit diagram of a rectifier circuit.

FIG. 6 shows connections between the ac power supply 202, the input primary coil formation portion 101, the input secondary coil formation portion 117, and the rectifier circuit 116b shown in FIGS. 1A, 1B, and 2. A plurality of input primary coils 208 are provided in the input primary coil formation portion 101. A plurality of input secondary coils 207 are provided in the input secondary coil formation portion 117.

The inspection ac signal supplied from the ac power supply 202 is input to each input primary coil 208. When the ac signal is input to the input primary coil 208, an ac voltage is generated as electromotive force across the corresponding input secondary coil 207 and is applied to the rectifier circuit 116b.

"Rectifier circuit" in this embodiment denotes a circuit which generates a power supply voltage from an ac voltage supplied to it, and "dc power supply voltage" denotes a voltage applied to each circuit or circuit element and maintained at a certain level.

The rectifier circuit 116b shown in FIG. 6 has diodes 601, capacitors 604, and resistors 603. Each diode 601 converts the input ac voltage into a dc voltage by rectification.

FIG. 7A shows changes in alternating current with time before rectification by the diode 601, and FIG. 7B shows changes in voltage with time after rectification. As can be understood from comparison between the graph of FIG. 7A and the graph of FIG. 7B, a pulsating current appears after rectification, whose voltage has a value of zero or a value with one polarity in every half period.

It is difficult to use the voltage of the pulsating current shown in FIG. 7B as a power supply voltage. Ordinarily, smoothing of such a pulsating current is performed by storing, in a capacitor, electric charge carried by the pulsating current to convert the pulsating current into a dc voltage. However, if a capacitor having a capacity large enough to sufficiently smooth the pulsating current is formed by using a thin-film semiconductor, it is necessary to increase the area occupied by the capacitor to an extremely large value. Therefore smoothing using such a capacitor is not practically realizable. According to the present invention, the voltages of pulsating currents having different phases after rectification are combined (added) to obtain a smoothed voltage. The above-described arrangement enables pulsating currents to be sufficiently smoothed even if the capacitance of smoothing capacitors is small. Further, a sufficiently high smoothing effect can be achieved without positively providing capacitors.

Referring to FIG. 6, ac signals having different phases are input to four primary coils to output four pulsating current voltages differing in phase through four diodes 601. The four pulsating current voltages are added together to generate a dc power supply voltage, the level of which is maintained generally constantly. This dc power supply voltage is supplied to one of the circuits in the subsequent stages.

However, the present invention is not limited to the structure shown in FIG. 6, in which four pulsating current signals which are output from the four diodes 601, and which differ in phase from each other, are added together to generate a dc power supply voltage. The number of phase divisions is not limited to four. The number of phase divisions may be freely selected if the voltage obtained by smoothing the output from the rectifier circuit can be used as a power supply voltage.

FIGS. 8A, 8B, and 8C are diagrams each showing changes with time in a power supply voltage obtained by adding a plurality of rectified signals together. FIG. 8A shows an example of generation of one power supply voltage by the addition of the voltages of four pulsating currents differing in phase.

The voltage generated in the rectifier circuit in accordance with the present invention has a ripple which is a component other than the direct current since it is generated by adding a plurality of pulsating currents. The ripple corresponds to the difference between the maximum and the minimum of the voltage. If the ripple is smaller, the voltage generated in the rectifier circuit becomes more approximate to a direct current voltage and becomes easier to use as a power supply voltage.

FIG. 8B shows changes with time in a power supply voltage obtained by adding the voltages of eight pulsating currents differing in phase. From comparison with the changes in power supply voltage with time shown in FIG. 8A, it can be understood that the ripple in this case is smaller.

FIG. 8C shows changes with time in a power supply voltage obtained by adding the voltages of sixteen pulsating currents differing in phase. From comparison with the changes in voltage with time shown in FIG. 8B, it can be understood that the ripple in this case is further reduced.

As can be understood from these graphs, the ripple in the power supply voltage can be reduced by adding an increased number of pulsating currents differing in phase to approximate the power supply voltage to a dc current. Thus, if the number of phase divisions is increased, the effect of smoothing the power supply voltage output from the rectifier circuit is improved. Also, if the capacitance of a capacitor 602 is increased, the effect of smoothing the power supply voltage output from the rectifier circuit is improved.

Power supply voltages generated in a rectifier circuit 116b are output through terminals 610 and 611. More specifically, a voltage closer the ground potential is output through the terminal 610, while a power supply voltage of the positive polarity is output through the terminal 611. It is possible to reverse the polarities of the power supply voltages by reversely connecting the anode and cathode of the diodes. The diodes 602 connected to the terminals 610 and 611 have the anode and cathode connected reversely relative to those of the diodes 601 connected to terminals 612 and 613. Therefore, while a voltage closer to the ground potential is output through the terminal 612, a power supply voltage of the negative polarity is output through the terminal 613.

Various circuits or circuit elements are formed on the element substrate and the power supply voltages to be supplied to the circuits of the circuit elements vary depending on the kinds of the circuits of the circuit elements or the purpose of use of the circuits of the circuit elements. In the rectifier circuit shown in FIG. 6, the level of the voltage supplied to each terminal can be adjusted by controlling the amplitudes of input ac signals. Further, the levels of the power supply voltages supplied to the circuits of the circuit elements can be changed by changing the terminals for connection to the circuits of the circuit elements.

The rectifier circuit used in accordance with the present invention is not limited to the half-wave rectifier circuit shown in FIG. 6. Any circuit capable of generating a dc power supply voltage from an input ac signal may suffice as the rectifier circuit in accordance with the present invention.

Figure 18A:
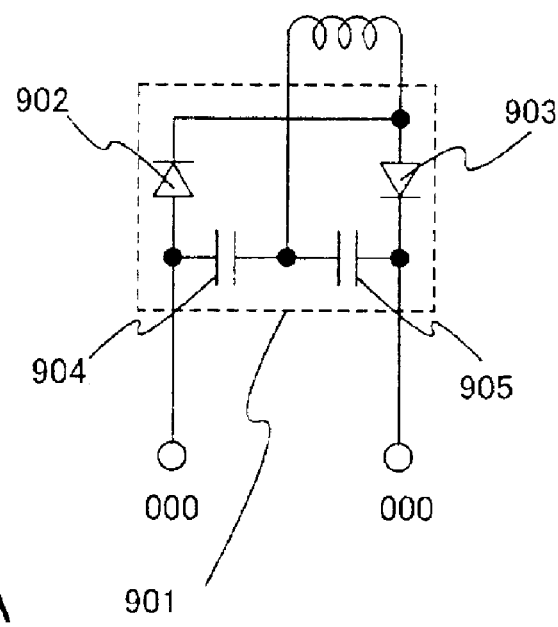
FIGS. 18A and 18B are circuit diagrams of rectifier circuits.
Figure 18B:
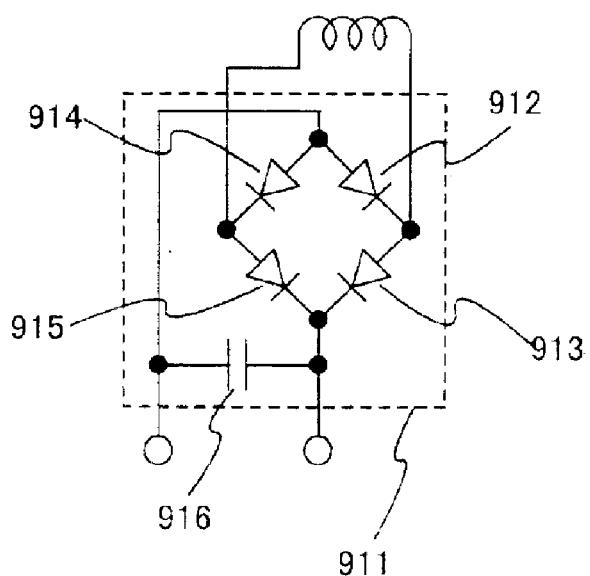

FIGS. 18A and 18B are circuit diagrams showing rectifier circuits differing in structure from that shown in FIG. 6. The rectifier circuit shown in FIG. 8A is a voltage-doubler full-wave rectifier circuit 901 having two diodes 902 and 903, and capacitors 904 and 905. The positions and the number of capacitors are not limited to those shown in FIG. 18A.

Both the cathode of the diode 902 and the anode of the diode 903 are connected to one terminal of one input secondary coil. It is possible to obtain a dc voltage twice as high as that obtained by the half-wave rectifier circuit shown in FIG. 6 by providing a plurality of voltage-doubler full-wave rectifier circuits 901 and by adding together the outputs from the rectifier circuits 901.

The rectifier circuit shown in FIG. 8B is a bridge rectifier circuit 911 having four diodes 912, 913, 914, and 915, which form a bridge circuit. The bridge rectifier circuit shown in FIG. 8B also has a capacitor 916. The positions and the number of capacitors are not limited to those shown in FIG. 18B.

The structure of the inspection-only circuit 119 shown in FIG. 2 will be described in detail.

Figure 9:
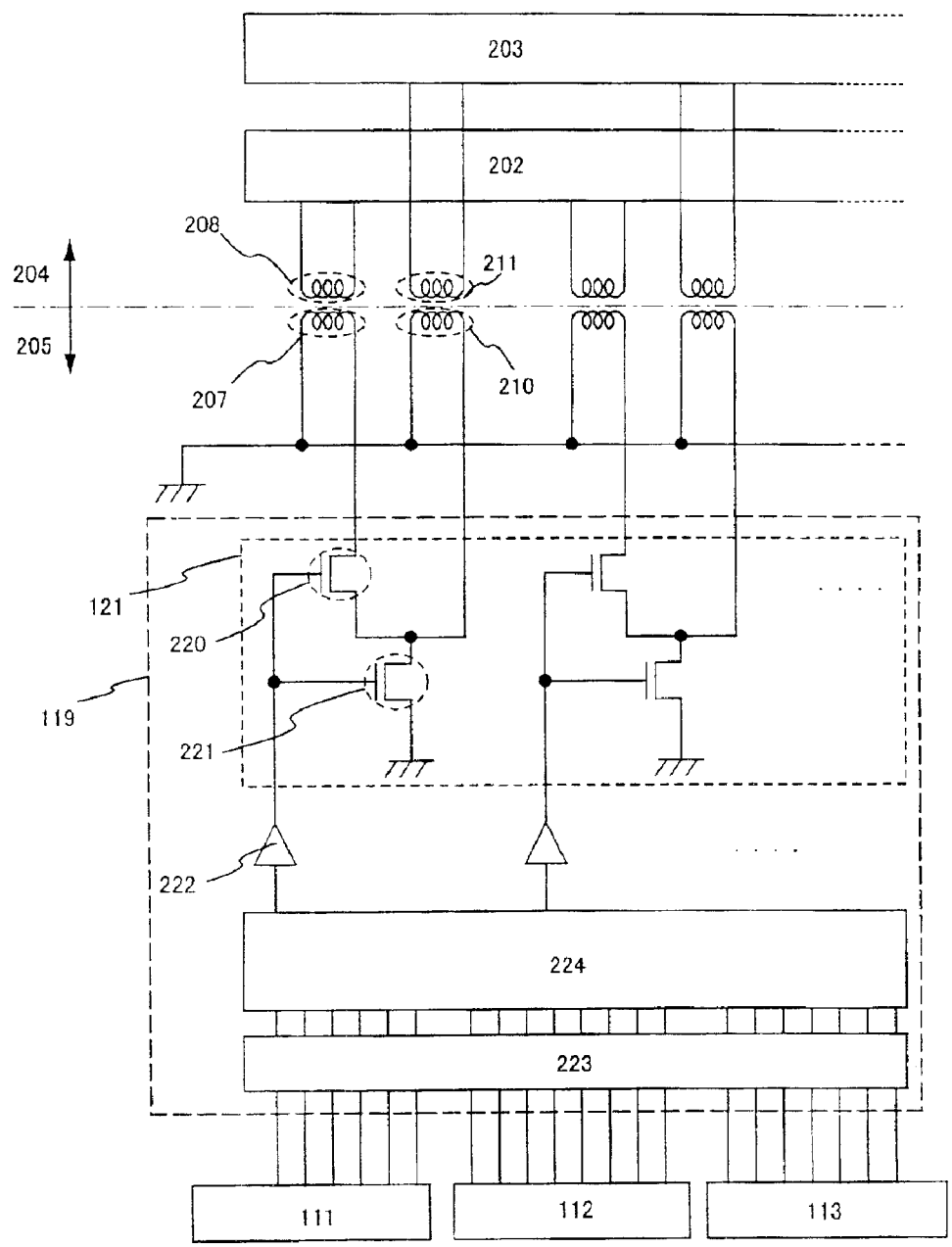
FIG. 9 is a circuit diagram of an inspection-only circuit.

FIG. 9 shows the structure of the inspection-only circuit 119. The inspection-only circuit 119 has means for performing signal processing on outputs from the circuits of the circuit elements, which are objects to be inspected, to obtain signals (operation information signals) including information on the operating conditions of the inspected circuits or circuit elements. In this embodiment, an analog to digital (AID) converter circuit 223 and a data format section 224 are used as this processing means.

Analog outputs from the circuits of the circuit elements in the signal line drive circuit 111, the scanning line drive circuit 112, and the pixel portion 113 are converted into digital signals in the A/D converter circuit 223. The digital signals are input to the data format section 224. If the outputs from the circuits of the circuit elements are not analog signals but digital signals, the digital signals are input directly to the data format section 224.

In this embodiment, all the signals output from the circuits of the circuit elements are converted into digital signals on which processing is performed in the data format section 224. However, the present invention is not limited to this arrangement. All the signals output from the circuits of the circuit elements may be converted into analog signals, which are processed in the data format section 224.

In the data format section 224, computational processing is performed on the input digital signals corresponding to the circuits of the circuit elements to form an operation information signal, which is a signal including information on the operating conditions of the inspected circuits or circuit elements. More specifically, the operation information signals may be a serial signal converted from digital signals by temporarily storing the digital signals which are input in parallel with each other, and by sequentially reading out the stored digital signals, or signals obtained in such a manner that the voltages of digital signals input in parallel with each other are successively output in accordance with predetermined timing. The voltage of the operation information signals output from the data format section 224 may be changed in correspondence with the difference between a case where the outputs from the inspected circuits or circuit elements are digital signals having the same voltage and a case where the outputs are digital signals but the voltage of at least one of the digital signals is different from that of the others. Any operation information signal may suffice if it enables determination as to whether each inspected circuit or circuit element is defective or non-defective and ascertainment of the location of a defective portion.

The operation information signal output from the data format section 224 is amplified by a buffer 222 and is input to the modulation circuit 121. The arrangement may alternatively be such that the buffer 222 is not provided and the output from the data format section 224 is input directly to the modulation circuit 121.

On the other hand, the inspection ac signal is input to each input primary coil 208 from the ac power supply 202. When the ac signal is input to the input primary coil 208, an ac voltage is generated as electromotive force across the corresponding input secondary coil 207 and this ac voltage is applied to the modulation circuit 121.

The modulation circuit 121 has means for modulating the amplitude of the ac voltage input from the input secondary coil 207 with the operation information signal input from the data format section 224 or the buffer 222. In FIG. 9, transistors 220 and 221 are provided as this modulation means. However, the present invention is not limited to this arrangement. The modulation circuit 121 may be provided with any structure if it can modulate the amplitude of the ac voltage input from the input secondary coil 207 with the operation information signal-input from the data format section 224 or the buffer 222.

In the modulation circuit 121 shown in FIG. 9, the output from the buffer 222 is input to the gate electrodes of the transistors 220 and 221. One of the source and drain regions of the transistor 220 is connected to the first terminal of the input secondary coil 207, while the other of the source and drain regions is connected to the first terminal of the output primary coil 210. One of the source and drain regions of the transistor 221 is connected to the first terminal of the output primary coil 210, while a constant voltage is applied to the other of the source and drain regions. This constant voltage may be the ground potential.

In the above-described arrangement, the voltage of the alternating current output from the input secondary coil 207 is modulated with the operation information signal and is input as a modulated signal to the first terminal of the output primary coil 210. In this embodiment, the ac voltage output from the input secondary coil 207 is modulated in a switching manner with the operation information signal to be input as a modulated signal to the first input terminal of the output primary coil 210.

A constant voltage is similarly applied to the respective second terminals of the input secondary coil 207 and the output primary coil 210. This constant voltage may be the ground potential.

When the output primary coil 210 and the output secondary coil 211 are electromagnetically coupled to each other, an ac voltage is generated as electromotive force between the pair of terminals of the output secondary coil 211. This ac voltage is input to the inspection section 203.

The inspection section 203 can ascertain whether each inspected circuit or circuit operates normally from the ac voltage input from the output secondary coil 211.

If the frequency of the ac voltage input to the inspection-only circuit is increased, the frequency of the modulated signal supplied from the inspection-only circuit to the terminal of each output primary coil is also increased. The impedance of the coil is determined by various factors, e.g., coil design, including the number of turns and the size of the coil, and the frequency of the signal input to the coil. Therefore it is desirable that the frequency of the ac voltage before modulation, which is input to the inspection-only circuit be determined by considering the other factors essential in determination of the coil impedance value.

The operation information signal may have a dc component in some cases, depending on the operating condition of the inspected circuit or circuit element. Even if the operation information signal has a dc component, it is possible to produce, between the terminals of the output secondary coil, electromotive force including information on a defective/non-defective condition by supplying the ac modulated signal formed by modulation with the operation information signal to the terminal of the output primary coil.

This embodiment mode has been described with respect to an element substrate having drive circuits, i.e., a signal line drive circuit and a scanning line drive circuit, as an example. However, element substrates inspected in accordance with the present invention are not limited to this type of element substrate. Even an element substrate having only a pixel portion can be inspected by using the inspection method of the present invention. Also, test circuits to be evaluated, which is called a test element group (TEG), and which is a group of discrete components or a group of circuits composed of discrete components, can also be inspected by using the inspection method and inspection device of the present invention to inspect the operating condition.

While this embodiment mode has been described with respect to the method of inspecting an element substrate of a liquid crystal display, semiconductor display devices other than liquid crystal displays can also be inspected by using the inspection method described in the description of the mode of implementation. Also, any semiconductor devices utilizing the characteristics of a semiconductor formed on a substrate, not limited to semiconductor display devices, can be inspected by using the inspection method of the present invention. Such semiconductor devices include a semiconductor device using a semiconductor thin film formed on a glass substrate, and a semiconductor device formed on a monocrystalline silicon substrate.

However, it is necessary to suitably design the coils by selecting the number of coils, etc., according to the kind and the specifications of the semiconductor device. It is also necessary to suitably set the waveform, frequency and amplitude of the inspection ac signal input to each input primary coil formation portion according to the kind and the specifications of the semiconductor device.

With the above-mentioned arrangements, the present invention enables determination of a defective/non-defective condition without setting probes directly on wirings. The possibility of minute dust being produced by setting probes is eliminated to prevent a reduction in yield in subsequent processes. The inspection method of the present invention, unlike optical inspection methods, enables determination of defective/non-defective results of all the pattern forming steps by one inspection step, thus simplifying the inspection step.

Embodiments of the present invention will be described below.

(Embodiment 1)

Embodiment 1 of the present invention will be described with respect to an example of inspection performed in such a manner that while no output primary coils and no output secondary coils are provided, weak electromagnetic waves or electric fields generated when circuits of the circuit elements are driven are monitored to detect a portion not operating normally in a multiplicity of the circuits or circuit elements.

Figure 10:
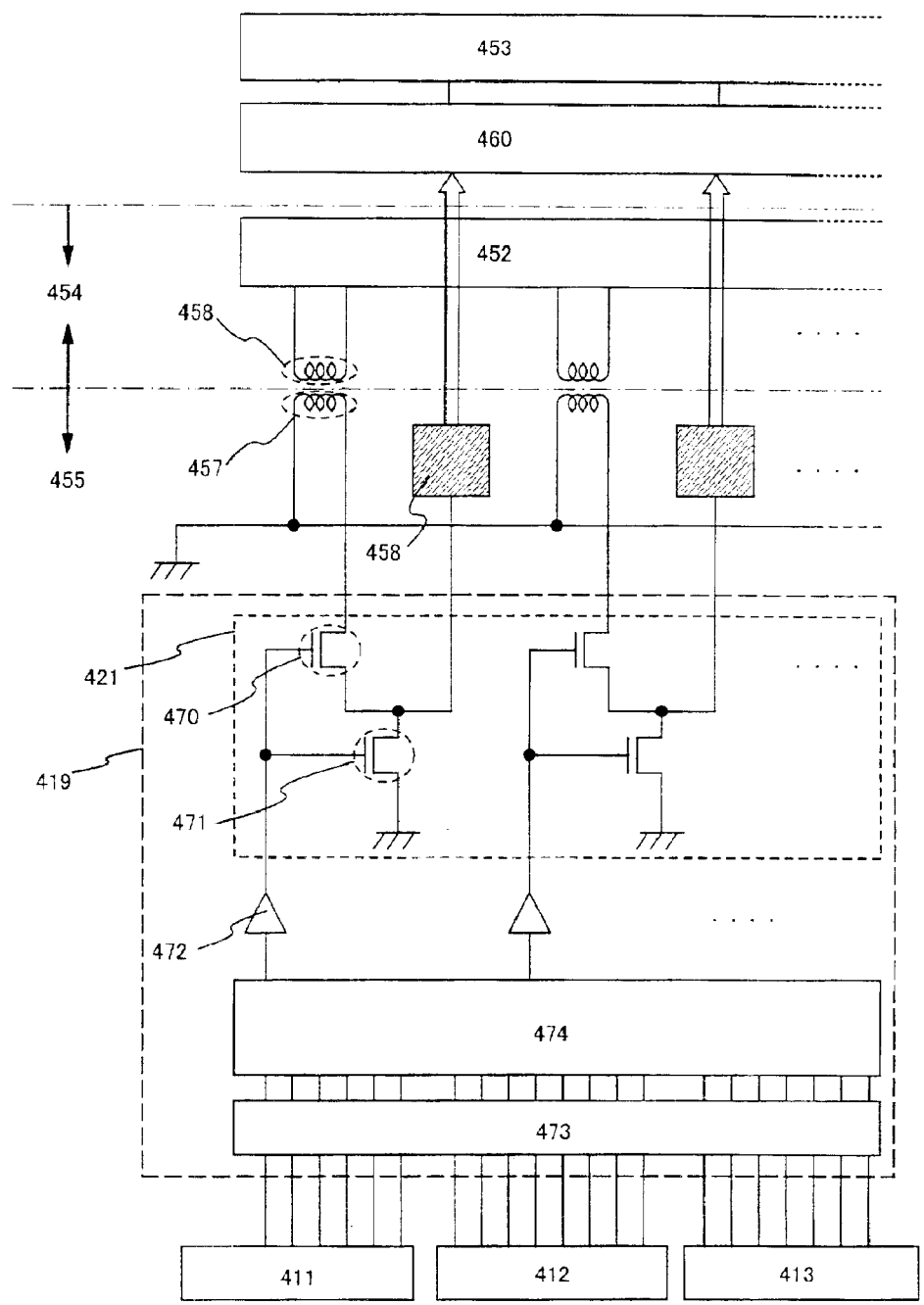
FIG. 10 is a circuit diagram of an inspection-only circuit having output pads.

FIG. 10 shows the structures of an element substrate 455 and an inspection substrate 454 in this embodiment. The element substrate 455 has an inspection-only circuit 419. The inspection-only circuit 419 has means for performing signal processing on outputs from the circuits of the circuit elements, which are objects to be inspected, to form signals (operation information signals) including information on the operating conditions of the inspected circuits or circuit elements. In this embodiment, an A/D converter circuit 473 and a data format section 474 are used as this processing means.

In this embodiment, the element substrate 455 has a signal line drive circuit 411, a scanning line drive circuit 412, and a pixel portion 413. Analog outputs from the circuits of the circuit elements in the signal line drive circuit 411, the scanning line drive circuit 412, and the pixel portion 413 are converted into digital signals in the A/D converter circuit 473. The digital signals are input to the data format section 474. If the outputs from the circuits of the circuit elements are not analog signals but digital signals, the digital signals are input directly to the data format section 474.

In this embodiment, all the signals output from the circuits of the circuit elements are converted into digital signals on which processing is performed in the data format section 474. However, the present invention is not limited to this arrangement. All the signals output from the circuits of the circuit elements may be converted into analog signals, which are processed in the data format section 474.

In the data format section 474, computational processing is performed on all the input digital signals corresponding to the circuits of the circuit elements to form operation information signals, which include information on the operating conditions of the inspected circuits or circuit elements.

The operation information signals output from the data format section 474 are amplified by a buffer 472 and are input to a modulation circuit 421. The arrangement may alternatively be such that the buffer 472 is not provided and the output from the data format section 474 is input directly to the modulation circuit 421.

On the other hand, an inspection ac signal is input from an ac power supply 452 to each of input primary coils 458 provided on the inspection substrate 454. When the ac signal is input to the input primary coil 458, an ac voltage is generated as electromotive force across the corresponding one of input secondary coils 457 provided on the element substrate 455 and this ac voltage is applied to the modulation circuit 421.

The modulation circuit 421 has means for modulating the amplitude of the ac voltage input from the input secondary coil 457 with the operation information signal input from the data format section 474 or the buffer 472. In FIG. 10, transistors 470 and 471 are provided as this modulation means. However, the present invention is not limited to this arrangement. The modulation circuit 421 may be provided with any structure if it can modulate the amplitude of the ac voltage input from the input secondary coil 457 with the operation information signal input from the data format section 474 or the buffer 472.

In the modulation circuit 421 shown in FIG. 10, the output from the buffer 472 is input to the gate electrodes of the transistors 470 and 471. One of the source and drain regions of the transistor 470 is connected to the first terminal of the input secondary coil 457, while the other of the source and drain regions is connected to an output pad 459 provided on the element substrate 455. One of the source and drain regions of the transistor 471 is connected to the output pad 459, while a constant voltage is applied to the other of the source and drain regions. This constant voltage may be the ground potential.

A constant voltage is applied to the second terminal of the input secondary coil 457. This constant voltage may be the ground potential.

In the above-described arrangement, the ac voltage output from the input secondary coil 457 is modulated with the operation information signal and is input as a modulated signal to the output pad 459.

A weak electromagnetic wave or electric field is generated at the output pad 458. In a measuring section 460 provided separately from the inspection substrate 454 and the element substrate 455, this electromagnetic wave or electric field is monitored to obtain as data to be input to an inspection section 453. In the inspection section 453, it is possible to ascertain, from this data, whether the inspected circuit or circuit element is operating normally.

Any of various sorts of information on the electromagnetic wave or electric field can be monitored and used. More specifically, it is possible to collect the frequency, phase, intensity, time, etc., as information on the electromagnetic wave or electric field in various dimensions. According to the present invention, any sort of information on the electromagnetic wave or electric field may be used if it enables detection of a portion not operating normally in the multiplicity of the circuits or circuit elements.

A well-known method may be used as a method of monitoring the weak electromagnetic wave or electric field generated at each circuit or circuit element. In the description of this embodiment, an example of a method in which the electric field generated at each circuit or circuit element is detected in the inspection step by using an electro-optical effect, more specifically a method for measurement using a Pockels cell will be described.

The Pockels cell is one of electro-optical devices using the Pockels effect which is one of the known electro-optical effects. An electro-optical device is an element using an electro-optical effect such that the refractive index of an element changes when an electric field is applied to the element. The device can be used to modulate or shut off light or to generate or detect circularly polarized light by utilizing this characteristic, i.e., by applying an ac voltage or a pulse voltage to a crystal The Pockels cell has a first electrode, a second electrode, and a Pockels crystal which is a ferroelectric crystal. The Pockels crystal is interposed between the first and second electrodes. Each of the first and second electrodes is made of a translucent electroconductive material.

A constant voltage is applied to the first electrode. The first and second electrodes are placed parallel to the element substrate so that the second electrode and the output pad 458 are superposed on one another. The second electrode may be placed adjacent to the element substrate 455 or spaced a certain distance apart from the element substrate 455. A cushioning material may be interposed between the second electrode and the element substrate 455.

The index of refraction of light at the portion of the Pockels cell superposed on the output pad 458 is changed by the electric field generated from the output pad 458. This refractive index is changed according to the intensity of the electric field generated from the output pad 458. Therefore, the intensity of the electric field generated from the output pad 458 can be measured by monitoring the index of refraction of light at the Pockels cell.

More specifically, light traveling along a direction perpendicular to the element substrate in the light passing through the Pockels cell is separated by using an optical system component such as a polarizing beam splitter, the intensity of the separated light is monitored and the refractive index of the Pockels cell is computed from the monitored intensity of light. The voltage applied to the Pockels cell can be obtained from the refractive index. It is possible to detect a defective portion from the voltage applied to the Pockels cell.

Some computational processing may be performed on the results of monitoring performed a certain number of times to make determination of a defective/non-defective condition.

The output from each inspected circuit is input to the inspection-only circuit and the intensity of the electromagnetic wave or electric field generated at the output pad is measured with an electro-optical device. In this method, there is no need to individually monitor each inspected circuit or circuit element by using a Pockels cell at the inspected circuit or circuit element, thus simplifying the inspection step and reducing the inspection time.

The Pockels crystal used in this embodiment may be typically a crystal of $NH_4H_2PO_4$, $BaTiO_3$, $KH_2PO_4$(KHP), $KD_2PO_4$(KDP), $LiNbO_3$, ZnO, or the like. The Pockels crystal used in this embodiment, however, is not limited to the crystal of these materials. Any crystal suffices if it has a Pockels effect.

The electro-optical device used to sense the electric field intensity in this embodiment is not limited to the Pockels cell. Any electro-optical device designed to utilize a phenomenon in which its optical characteristic is changed by application of a voltage can be used in the inspection method or the inspection device of the present invention. Therefore, a liquid crystal may be used in the method or the device of the present invention.

In this embodiment, if the frequency of the ac voltage input to the inspection-only circuit is increased, the frequency of the modulated signal input from the inspection-only circuit to the output pad is also increased.

(Embodiment 2)

Inspection drive signals and power supply voltages in a liquid crystal display and an OLED display will be described in more detail as an example.

The number of primary and secondary coils is changed according to the constructions of the pixel portion and the drive circuits on the element substrate. Therefore it is important to set the number of coils according to the specifications of each element substrate.

Figure 11:
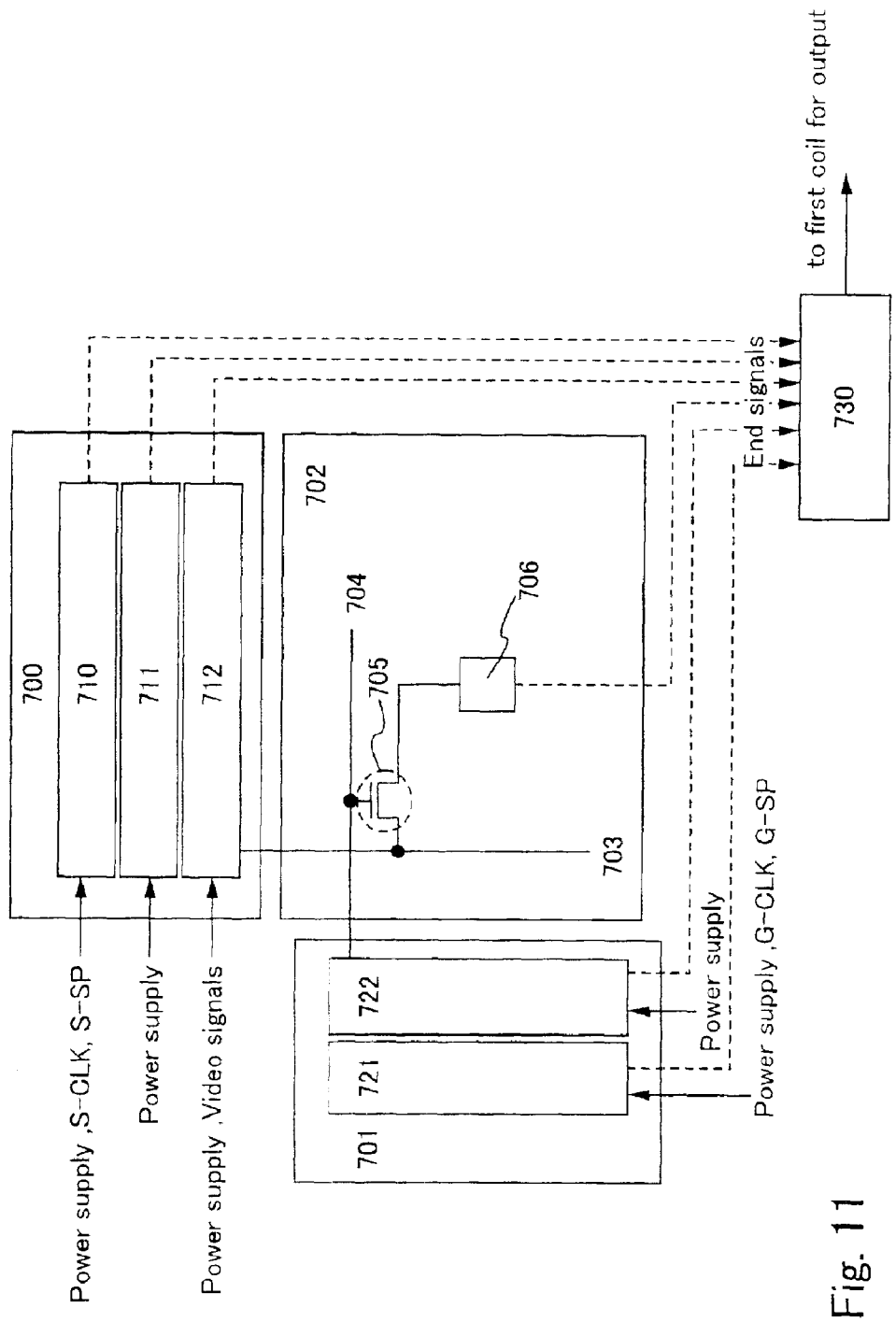
FIG. 11 is a block diagram of an element substrate of a liquid crystal display.

FIG. 11 shows the structure of circuits on an element substrate of an ordinary liquid crystal display. The element substrate shown in FIG. 11 has a signal line drive circuit 700, a scanning line drive circuit 701, and a pixel portion 702.

A plurality of signal lines and a plurality of scanning lines are formed in the pixel portion 702. A region between signal lines and between scanning lines corresponds to a pixel forming segment. Only a pixel forming segment with one signal line 703 and one scanning line 704, which is representative of a plurality of pixels, is shown in FIG. 11. Each pixel forming segment has a pixel TFT 705 formed as a switching element and a pixel electrode 706 for driving a liquid crystal cell.

The gate electrode of the pixel TFT 705 is connected to the scanning line 704. One of the source and drain regions of the pixel TFT 705 is connected to the signal line 703, while the other of the source and drain regions is connected to the pixel electrode 706.

The signal line drive circuit 700 has a shift register 710, a level shifter 711, and an analog switch 712. Power supply voltages (Power Supply) are supplied to the shift register 710, the level shifter 711, and the analog switch 712. A signal line drive circuit clock signal (S-CLK) and a start pulse signal (S-SP) are supplied to the shift register 710. Video signals are supplied to the analog switch 712.

When the clock signal (S-CLK) and the start pulse signal (S-SP) are input to the shift register 710, a sampling signal which determines timing of sampling of video signals is generated and input to the level shifter 711. The amplitude of the voltage of the sampling signal is increased by the level shifter 711, and the sampling signal is then input to the analog switch 712. In the analog switch 712, the input video signals are sampled in synchronization with the input sampling signal and the sampled video signals are input to the signal line 703.

On the other hand, the scanning line drive circuit has a shift register 721 and a buffer 722. Power supply voltages (Power Supply) are supplied to the shift register 721 and the buffer 722. A scanning line drive circuit clock signal (G-CLK) and a start pulse signal (G-SP) are supplied to the shift register 721.

When the clock signal (G-CLK) and the start pulse signal (G-SP) are input to the shift register 721, a selection signal which determines timing of selection of the scanning lines is generated and input to the buffer 722. The selection signal input to the buffer 722 is buffered and amplified and is then input to the scanning line 704.

When the scanning line 704 is selected, the pixel TFT 705 whose gate is connected to the selected scanning line 704 is turned on. The sampled video signal input to the signal line is supplied to the pixel electrode 706 through the pixel TFT 705 in the on state.

When the signal line drive circuit 700, the scanning line drive signal 701 and the pixel portion 702 operate as described above, the outputs from the circuits of the circuit elements (End Signals) are input to an inspection-only circuit 730. In the inspection-only circuit, operation information signals are formed from the outputs from the circuits of the circuit elements and modulated signals are formed by modulation with the operation information signals. The modulated signals are input to output primary coils. AC voltages thereby generated in output secondary coils are input to an inspection section. In the inspection section, the input voltages are inspected to determine whether each circuit or circuit element is operating normally. The arrangement may alternatively be such that when the signal line drive circuit 700, the scanning line drive circuit 701 and the pixel portion 702 operate, electromagnetic waves or electric fields generated at the circuits of the circuit elements are monitored by using some means to determine whether each circuit or circuit element is operating normally.

For example, in a case where the shift register 710 is formed by using a plurality of flip-flops, a voltage supplied to and stored in the first flip-flop is supplied to and stored in the second flip-flop, then supplied to and stored in the third flip-flop, and so on in synchronization with S-CLK. The plurality of flip-flops operate successively to forward the voltage in this manner. In the sampling signal obtained by the flip-flops thus operating, a pulse appears at times shifted one from another. If the flip-flop in one stage does not operate normally, the flip-flops in the subsequent stages are unable to operate normally. In this shift register, therefore, the sampling signal obtained as a result of the operation of the flip-flop in the final stage can be used as an output (End Signal). The output obtained when one of the flip-flops of the shift register has a defective portion and does not operate normally differs in voltage waveform from the output obtained when all the flip-flops operate normally.

In the element substrate shown in FIG. 11, S-CLK, S-SP, G-CLK, G-SP, and video signals are input to the circuits as drive signals for inspection. However, drive signals used for inspection in accordance with the present invention are not limited to those described above. Any signals can be used as drive signals for inspection as long as they relate to drive. For example, a signal for determining the timings at which the direction of scanning with the scanning lines is changed and a signal for changing the direction of input of the selection signal to the scanning lines may be input as well as the above-described signals. However, it is essential to input a signal which enables determination of a defective/non-defective condition of each inspected circuit or circuit element.

In a case where not all the circuits but part of the circuits formed on the element substrate are inspected, it is not necessary to input all the above-described drive signals if determination of a defective/non-defective condition of the inspected circuits can be made. For example, when only the shift register 710 in the signal line drive circuit 700 is inspected, only inspection drive signals S-CLK and S-SP and the power supply voltage for inspection of the shift register 710 may be formed in the waveform shaping circuit and the rectifier circuit and input to the shift register 710.

Figure 12:
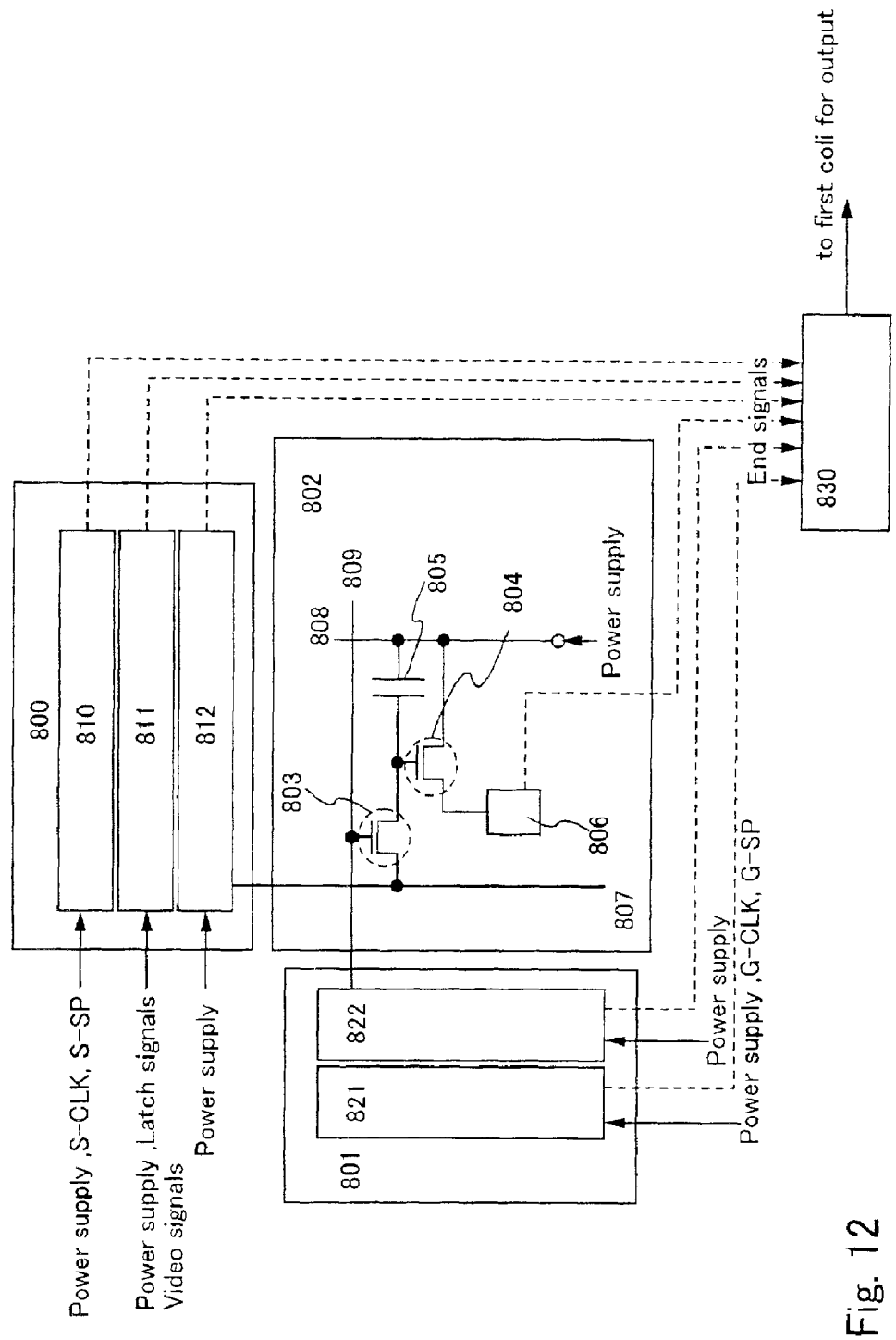
FIG. 12 is a block diagram of an element substrate of an OLED display.

FIG. 12 shows the structure of circuits on an element substrate of an ordinary OLED display. Drive circuits of an OLED display which displays an image by using digital video signals will be described with reference to FIG. 12 as an example. The element substrate shown in FIG. 12 has a signal line drive circuit 800, a scanning line drive circuit 801, and a pixel portion 802.

A plurality of signal lines, a plurality of scanning lines and a plurality of power supply lines are formed in the pixel portion 802. A region surrounded by the signal lines, between the scanning lines, and the power supply lines corresponds to a pixel forming segment. Only a pixel forming segment with one signal line 807, one scanning line 809 and one power supply line 808, which is representative of a plurality of pixels, is shown in FIG. 12. Each pixel forming segment has a switching TFT 803 formed as a switching element, a drive TFT 804, a storage capacitor 805, and a pixel electrode 806 for driving an OLED.

The gate electrode of the switching TFT 803 is connected to the scanning line 809. One of the source and drain regions of the switching TFT 803 is connected to the signal line 807, while the other of the source and drain regions is connected to the gate electrode of the drive TFT 804.

One of the source and drain regions of the drive TFT 804 is connected to the power supply line 808, while the other of the source and drain regions is connected to the pixel electrode 806. The gate electrode of the drive TFT 804 and the power supply line 808 form the storage capacitor 805. It is not essentially necessary to form the holding capacitor 805.

The signal line drive circuit 800 has a shift register 810, a first latch 811, and a second latch 812. Power supply voltages (Power Supply) are supplied to the shift register 810, the first latch 811, and the second latch 812. A signal line drive circuit clock signal (S-CLK) and a start pulse signal (S-SP) are supplied to the shift register 810. Latch signals for determining latch timing and video signals are supplied to the first latch 811.

When the clock signal (S-CLK) and the start pulse signal (S-SP) are input to the shift register 810, a sampling signal which determines timing of sampling of video signals is generated and input to the first latch 811.

The sampling signal from the shift register 810 may be buffered and amplified by a buffer or the like before being input to the first latch 811. Since many circuits or circuit elements are connected to the wiring to which the sampling signal is input, the load capacitance (parasitic capacitance) of the wiring is large. This buffer is effective in preventing "dulling" of the rising edge or falling edge of timing signal when the load capacitance is large.

The first latch 811 has a plurality of stages. In the first latch 811, the input video signals are sampled in synchronization with the input sampling signal and the sampled video signals are successively stored in the latches in the respective stages.

The time required to complete one cycle of writing video signals to the latches in all the stages of the first latch 811 is called a line period. In actuality, in some case, a period defined by adding a horizontal retrace period to this line period is referred to as a line period.

When one line period ends, latch signals are input to the second latch 812. At this instant, the video signals written and held in the first latch 811 are fed to the second latch 812 all at once to be written to and stored in the latches in all the stages of the second latch 812.

After the video signals have been fed from the first latch 811 to the second latch 812, writing of the video signals to the first latch 811 is successively performed on the basis of the sampling signal from the shift register 810.

During the one line period in which the second cycle of writing is performed, the video signals written and stored in the second latch 812 are input to the source signal lines.

On the other hand, the scanning line drive circuit has a shift register 821 and a buffer 822. Power supply voltages (Power Supply) are supplied to the shift register 821 and the buffer 822. A scanning line drive circuit clock signal (G-CLK) and a start pulse signal (G-SP) are supplied to the shift register 821.

When the clock signal (G-CLK) and the start pulse signal (G-SP) are input to the shift register 821, a selection signal which determines timing of selection of the scanning lines is formed and input to the buffer 822. The selection signal input to the buffer 822 is buffered and amplified and is then input to the scanning line 809.

When the scanning line 809 is selected, the switching TFT 803 whose gate electrode is connected to the selected scanning line 809 is turned on. The video signal input to the signal line is supplied to the gate electrode of the drive TFT 804 through the switching TFT 803 in the on state.

Switching of the drive TFT 804 is controlled on the basis of a information bit of 1 or 0 supplied to the gate electrode. When the drive TFT 804 is on, the potential of the power supply line is applied to the pixel electrode. When the drive TFT 804 is off, the potential of the power supply line is not applied to the pixel electrode.

When the signal line drive circuit 800, the scanning line drive signal 801 and the pixel portion 802 operate as described above, the outputs from the circuits of the circuit elements (End Signals) are input to an inspection-only circuit 830. In the inspection-only circuit 830, operation information signals are generated from the outputs from the circuits or the circuit elements and modulated signals are generated by modulation with the operation information signals. The modulated signals are input to output primary coils. AC voltages thereby generated in output secondary coils are input to an inspection section. In the inspection section, the input voltages are inspected to determine whether each circuit or circuit element is operating normally. The arrangement may alternatively be such that when the signal line drive circuit 800, the scanning line drive circuit 801 and the pixel portion 802 operate, electromagnetic waves or electric fields generated at the circuits of the circuit elements are monitored by using some means to determine whether each circuit or circuit element is operating normally.

In the element substrate shown in FIG. 12, S-CLK, S-SP, G-CLK, G-SP, latch signals, and video signals are input to the circuits as drive signals for inspection. However, drive signals used for inspection in accordance with the present invention are not limited to those described above. Any signals can be used as drive signals for inspection as long as they relate to drive. For example, a signal for determining the timings at which the direction of scanning with the scanning lines is changed and a signal for changing the direction of input of the selection signal to the scanning lines may be input as well as the above-described signals. However, it is essential to input a signal which enables determination of a defective/non-defective condition of each inspected circuit or circuit element.

In a case where not all the circuits but part of the circuits formed on the element substrate are inspected, it is not necessary to input all the above-described drive signals, and only drive signals with which the part of the circuits to be inspected are operated may be input. For example, when only the shift register 810 in the signal line drive circuit 800 is inspected, only inspection drive signals S-CLK and S-SP and the power supply voltage for inspection of the shift register 810 may be formed in the waveform shaping circuit and the rectifier circuit and input to the shift register 810.

If the power supply voltage is generated by adding together a plurality of pulsating signals which differ in phase from each other, the number of primary coils is also changed depending on the number of pulsating signals added.

Use of the inspection device and the inspection method of the present invention is not limited to inspection of the element substrate having the construction shown in FIGS. 11 and 12. The inspection device and the inspection method of the present invention can be used to inspect various kinds of semiconductor devices variously specified if operation information signals can be formed from outputs from the circuits or the circuit elements when the semiconductor device is supplied with drive signals and power supply voltages in a non-contact manner.

The present invention can be implemented by freely combining this embodiment with Embodiment 1.

(Embodiment 3)

An embodiment of the present invention will be described which relates to cutting of a large-size element substrate from which a plurality of display substrates are formed after inspection.

Figure 13:
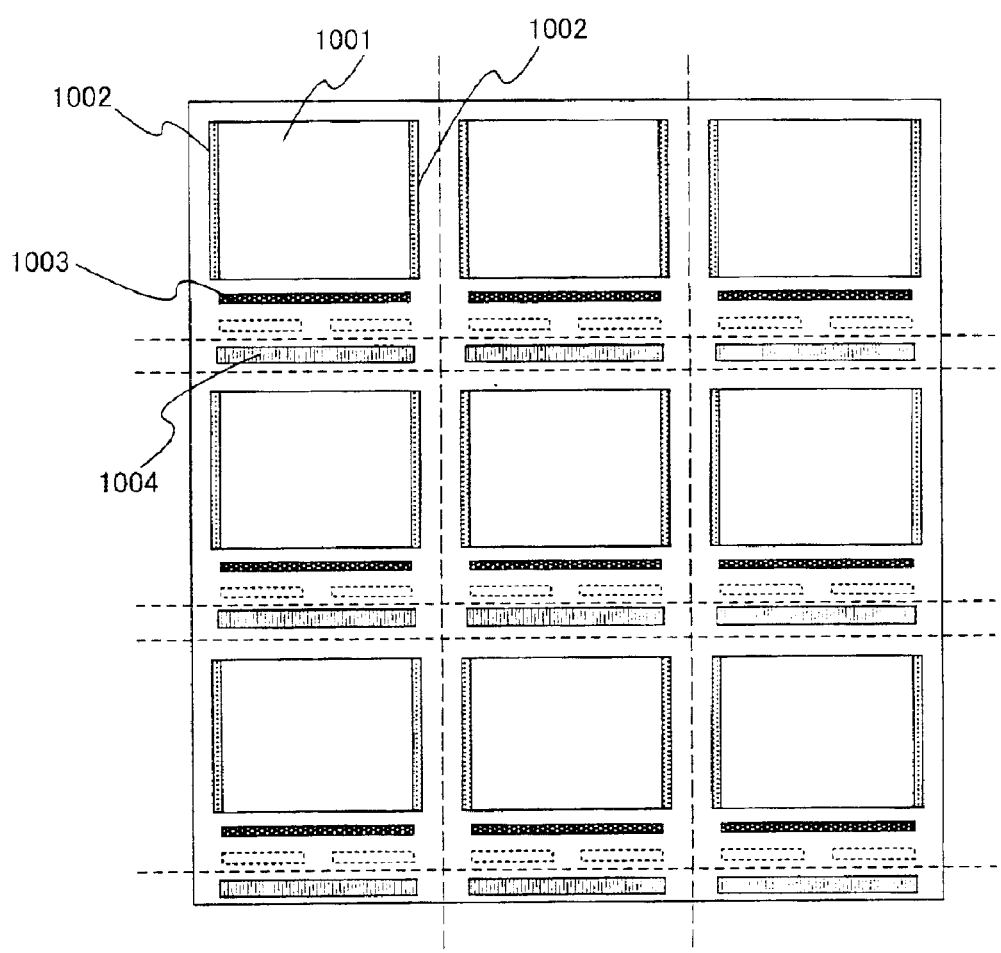
FIG. 13 is a top view of a large-size element substrate.

FIG. 13 is a top view of a large-size element substrate (also called an array substrate) before the substrate is cut. A pixel portion 1001, a scanning line drive circuit 1002, and a signal line drive circuit 1003 are provided on the element substrate. In the region indicated by 1004, there are formed circuits or circuit elements, such as a plurality of input secondary coils, a plurality of output primary coils, a waveform shaping circuit, a rectifier circuit, and an inspection-only circuit, which are used only in an inspection step, and which are not used after the completion of the inspection step.

The element substrate is cut along a line represented by a dotted line in FIG. 13, thus forming nine display substrates from one element substrate. While this embodiment has been described with respect to a case where nine display substrates are formed from one element substrate, the number of substrates obtained by dividing one large substrate in this embodiment is not limited to this number.

The element substrate is cut so that conductors in routing wiring and coil wiring are cut and broken to effect physical and electrical disconnection. On the element substrate shown in FIG. 13, the region 1004 is provided on a substrate portion other than that used in a display after cutting.

An example of cutting of a large-size element substrate different from the cutting shown in FIG. 13 will be described with reference to FIG. 14. A pixel portion 1101, a scanning line drive circuit 1102, and a signal line drive circuit 1103 are provided on the element substrate. In the region indicated by 1104, there are formed circuits or circuit elements, such as a plurality of input secondary coils, a plurality of output primary coils, a waveform shaping circuit, a rectifier circuit, and an inspection-only circuit, which are used only in an inspection step, and which are not used after the completion of the inspection step.

Figure 14:
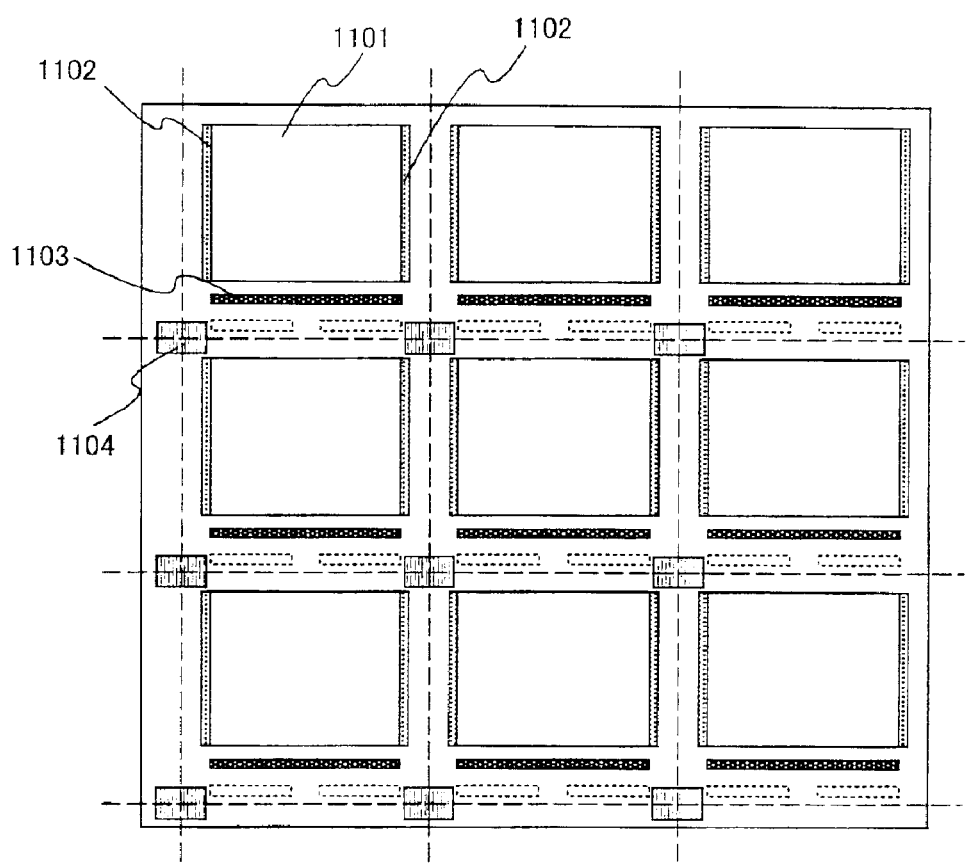
FIG. 14 is a top view of a large-size element substrate.

The element substrate is cut along a line represented by a dotted line in FIG. 14, thus forming nine display substrates from one element substrate. While this embodiment has been described with respect to a case where nine display substrates are formed from one element substrate, the number of substrates obtained by dividing one large substrate in this embodiment is not limited to this number.

The element substrate is cut so that conductors in routing wiring and coil wiring are cut and broken to effect physical and electrical disconnection. On the element substrate shown in FIG. 14, the region 1104 is provided on the substrate cutting line. The circuits or the circuit elements in the region 1104 are cut and broken after inspection. Since the circuits or the circuit elements formed in the region 1104 are unnecessary after inspection, there is no problem with the operation of the completed semiconductor device.

Also, the waveform shaping circuit or the rectifier circuit may be left on the substrate used in the semiconductor device or on the substrate not used in the semiconductor device after cutting, and may be broken after cutting.

The present invention can be implemented by freely combining this embodiment with the arrangement of Embodiment 1 or 2.

(Embodiment 4)

A fourth embodiment of the present invention will be described with respect to steps in an inspection step with reference to the flowchart of FIG. 15.

Figure 15:
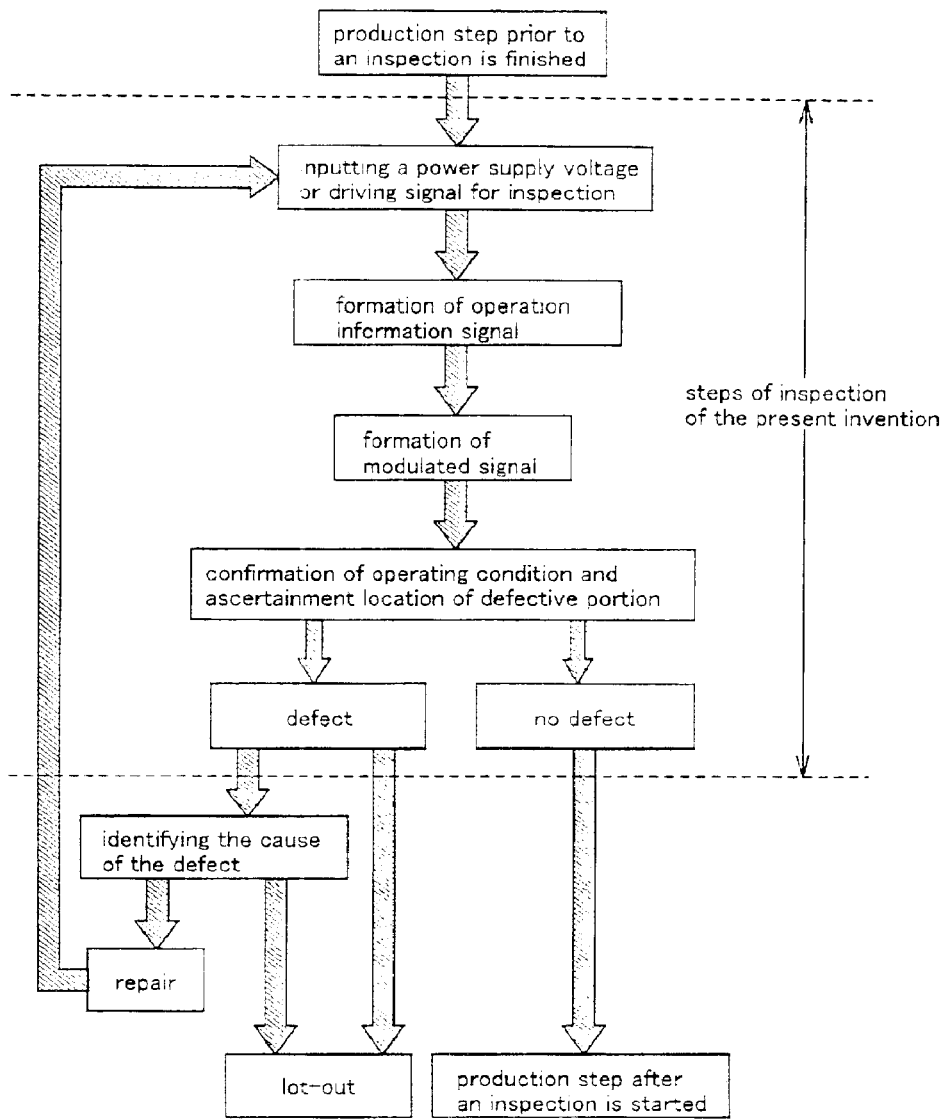
FIG. 15 is a flowchart showing a procedure of inspection steps in accordance with the present invention.

In the inspection step of the present invention shown in FIG. 15, after a manufacturing process, inspection power supply voltages or drive signals are input to the circuits or the circuit elements which are objects to be inspected.

The circuits or the circuit elements to be inspected are made to operate by being supplied with the inspection power supply voltages or drive signals, outputs from the circuits or the circuit elements are input to the inspection-only circuit, and operation information signals are generated in the inspection-only circuit.

The amplitude of an ac signal input to the inspection-only circuit is modulated with the operation information signals to form modulated signals, which are input to output primary coils. The output primary coils and output secondary coils are electromagnetically coupled to generate ac voltages across the output secondary coils. The ac voltages are input to the inspection section.

In the inspection section, it is possible to make determination of a defective/non-defective condition and to locate a defective portion. More specifically, the ac signal amplitude to be input to the inspection section when one circuit element is operating normally and the amplitude of the ac signal actually input to the inspection section when the circuit element to be inspected is operated are compared with each other. Alternatively, the amplitudes of the ac signals input from the identical circuits or circuit elements to the inspection section may be compared with each other or the amplitude value obtained by actual measurement may be compared with an amplitude value derived from a theoretical value computed on the basis of a simulation.

If the comparison result shows that the amplitude of the voltage of one of the ac signals input to the inspection section differs largely from the desired value, it is determined that the circuit or the circuit element corresponding to the different amplitude is defective.

Therefore, it is also possible to simultaneously ascertain the operating condition of each circuit or circuit element and the location of a defective portion. A person who carries out the present invention may set a suitable criterion on which determination is made as to whether each circuit or circuit element is operating normally. A criterion may be set such that when only one defective portion exists, it is determined that the inspected substrate is defective. Alternatively, a criterion may be set such that when a certain number of defective portions exist, it is determined that the inspected substrate is defective.

If it is determined that the inspected substrate is non-defective, the completion of inspection is recognized and the manufacturing process after the inspection step is started.

If it is determined that the inspected substrate is defective, the step of removing (lotting out) the substrate from the process not to complete it as a product or the step of ascertaining the cause of the defect is selected. In a case where a plurality of products are manufactured from one large substrate, substrates obtained by cutting the large substrate are separated into non-defectives and defectives, and the defectives are lotted out.

In a case where the cause of a defect is ascertained and it is determined that the substrate can be repaired, the inspection step in accordance with the present invention may be again performed after repairing to repeat the above-described steps. If it is determined that the substrate cannot be repaired, the substrate is lotted out at this point.

The present invention can be implemented by freely combining this embodiment with any of the structures of Embodiments 1 to 3.

(Embodiment 5)

A fifth embodiment of the present invention will be described with respect to details of coils used in accordance with the present invention and connections between the terminals of the coils and wiring (coil wiring).

Figure 16A:
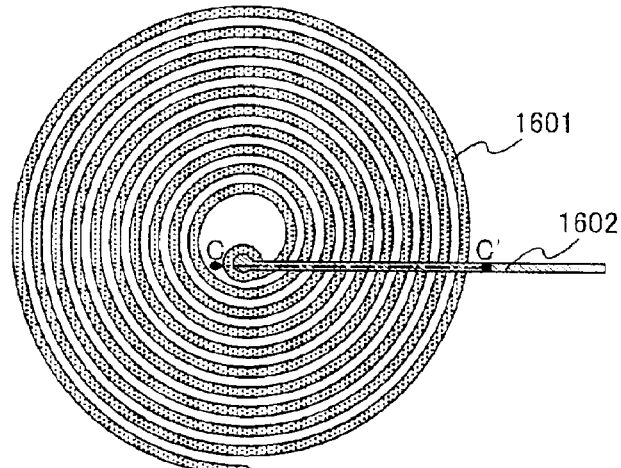
FIGS. 16A to 16D are top and cross-sectional views of coils.

Referring to FIG. 16A, a coil 1601 is formed on an insulating surface and an interlayer insulating film 1603 is formed on the insulating surface so as to cover the coil 1601. A contact hole is formed in the interlayer insulating film 1603 and a coil wiring 1602 is formed on the interlayer insulating film 1603 so as to connect to the coil 1601 via the contact hole.

Figure 16B:
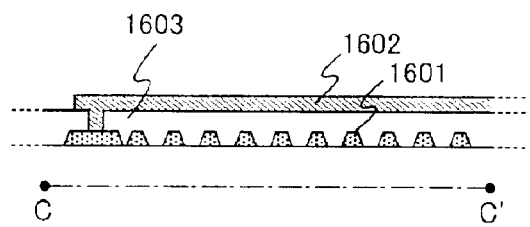

FIG. 16B is a cross-sectional view taken along the dot-dash line C–C' of FIG. 16A.

Figure 16C:
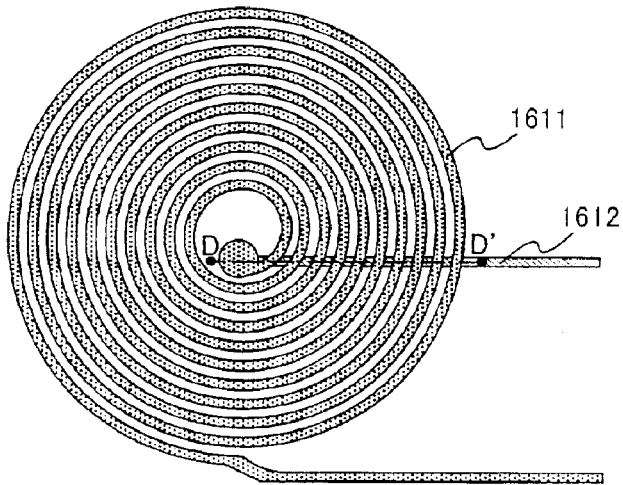

Referring to FIG. 16C, a coil wiring 1612 is formed on an insulating surface and an interlayer insulating film 1613 is formed on the insulating surface so as to cover the coil wiring 1612. A contact hole is formed in the interlayer insulating film 1613 and a coil 1611 is formed on the interlayer insulating film 1613 so as to connect to the coil wiring 1612 via the contact hole.

Figure 16D:
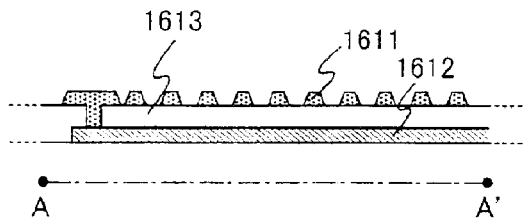

FIG. 16D is a cross-sectional view taken along the dot-dash line D–D' of FIG. 16A.

The method of forming coils used in accordance with the present invention is not limited to those described above. A spiral groove is formed by pattern forming an insulating film and a conductive film is formed on the insulating film so as to fill the groove. Thereafter the conductive film is etched or polished by chemical mechanical polishing (CMP) until the insulating film is exposed. The material of the conductive film is thereby left only in the groove. The material of the conductive film left in the groove can also be used as a coil.

The present invention can be implemented by freely combining this embodiment with any of the structures of Embodiments 1 to 4.

(Embodiment 6)

A sixth embodiment of the present invention will be described with respect to the structure of an inspection device for performing inspection in accordance with the inspection method of the present invention.

Figure 17:
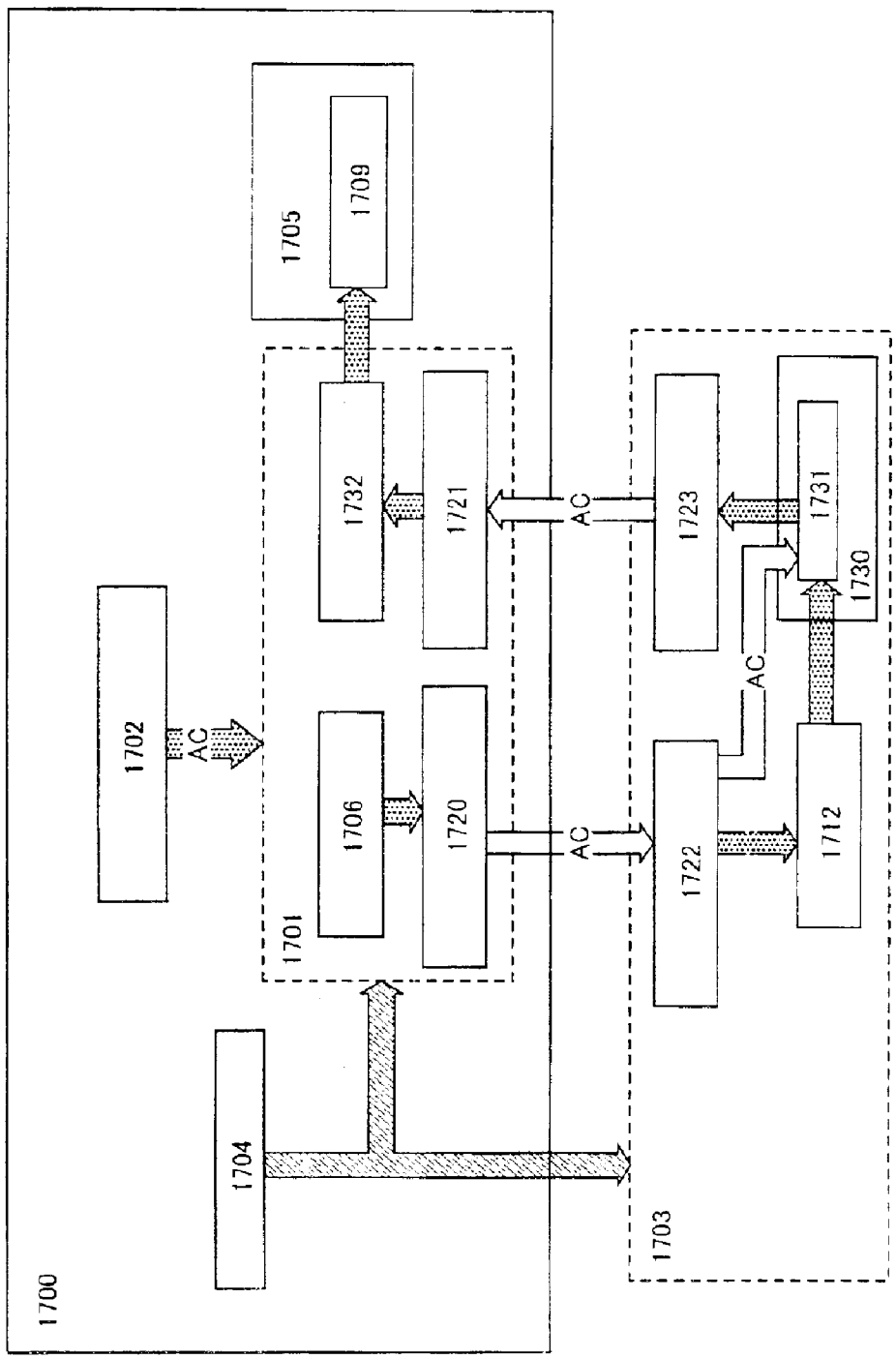
FIG. 17 is a block diagram of an inspection device.

FIG. 17 is a block diagram of an inspection device 1700 in accordance with the present invention. The inspection device 1700 shown in FIG. 17 has a signal source or an ac power supply 1702 input primary coils 1720, and output primary coils 1721, the input primary coils 1720 and the output primary coils 1721 being formed on an inspection substrate 1701. The inspection device 1700 also has substrate fixing means 1704 capable of overlapping the input primary coils 1720 and input secondary coils 1722 provided on an element substrate 1703 with a certain spacing maintained therebetween, and also capable of overlapping the output secondary coils 1721 and output primary coils 1723 provided on the element substrate 1703 with a certain spacing maintained therebetween. The inspection device 1700 further has means (inspection section 1705) for making a determination of a defective/non-defective condition from ac voltages generated across the output secondary coils 1721 from modulated signals produced on the element substrate 1703.

While the signal source or ac power supply 1702 in this embodiment is regarded as part of the inspection device 1700, it is not essentially necessary for the inspection device of the present invention to include the signal source or ac power supply 1702

AC signals produced in the signal source or ac power supply 1702 are input to an external input buffer 1706 provided on the inspection substrate 1701. The input ac signals are amplified or buffered and amplified by the external input buffer 1706 and are thereafter input to the input primary coils 1720 provided on the inspection substrate 1701.

The inspection substrate 1701 and the element substrate 1703 are positioned by the substrate fixing means 1704 so that the input primary coils 1720 and the input secondary coils 1722 are superposed on each other while being spaced a certain distance apart from each other.

Power supply voltages or drive signals generated from ac voltages generated across the input secondary coils 1722 are input to the circuits or the circuit elements provided on the element substrate 1703. The circuit provided on the element substrate 1703 to form the power supply voltages or drive signals is the same as that described above in detail in the description of this embodiment mode, and will not be described below.

Outputs from the circuits or the circuit elements 1712 are input to an inspection-only circuit 1730 having a modulation circuit 1731. The inspection-only circuit 1730 generates operation information signals from the outputs of the circuits or the circuit elements 1712, and inputs the operation information signals to the modulation circuit 1731.

On the other hand, ac voltages generated across the input secondary coils 1722 are input to the modulation circuit 1731. In the modulation circuit 1731, the input ac voltages are modulated with the operation information signals to form modulated signals. The formed modulated signals are input to the output primary coils 1723.

The inspection substrate 1701 and the element substrate 1703 are positioned by the substrate fixing means 1704 so that the output primary coils 1723 and the output secondary coils 1721 are superposed on each other while being spaced a certain distance apart from each other.

AC voltages are generated across the output primary coils 1723. The ac voltages are amplified or buffered and amplified by an external output buffer 1732 and are thereafter input to the inspection section 1705.

In the inspection section 1705, the input ac voltages are converted into numeric values, which are obtained as data (measured values) to be supplied to an computational section 1709 provided in the inspection section 1705.

In the computational section 1709, a determination is made on the basis of the input measured values as to whether each circuit or circuit element is non-defective or defective. For example, a comparison described below is made to enable this determination. The ac signals input to the inspection section when the circuit elements are operating normally are stored in a memory or the like, and the amplitude of each of the ac signals actually input to the inspection section when the circuit elements to be inspected are operated is compared with the corresponding ac signal stored in the memory. Alternatively, the amplitudes of the ac signals input from the identical circuits or circuit elements to the inspection section may be compared with each other or the amplitude values obtained by actual measurement may be compared with amplitude values derived from theoretical values computed on the basis of a simulation.

The present invention is not limited to these examples of the comparison method. Any method may be used if it enables detection of any one of the circuit elements from which a significantly different ac signal amplitude is input to the inspection section compared with the ac signal amplitude input to the inspection section when the normal circuit element is operated.

If the comparison result shows that the amplitude of one of the ac signals input to the inspection section is significantly different, it is determined that the corresponding circuit or circuit element is defective. In actuality, in many cases, the amplitude of each ac signal input to the inspection section varies in a certain cycle even if the corresponding circuit is normal. In such a situation, the average value of the amplitude in each cycle may be computed and compared with that of the normal components. Any method may be used for this comparison.

If electric fields or electromagnetic waves generated at the circuits or the circuit elements are monitored for determination of a defective/non-defective condition, there is no need to provide the output primary coils 1723, the output secondary coils 1721, and the external output buffer 1732. In this case, output pads are provided on the element substrate 1703 and modulated signals output from the modulation circuit 1723 are supplied to the output pads.

Also, a measuring section is provided in the inspection device, and electric fields or electromagnetic waves generated at the output pads are monitored in the measuring section and obtained as data to be supplied to the computational section 1709 provided in the inspection section 1705. In the computational section 1709, a determination is made on the basis of the input data as to the operating condition of each circuit or circuit element and the location of a defective portion.

The present invention can be implemented by freely combining this embodiment with any of the structures of Embodiments 1 to 5.

The above-described structures of the present invention enable determination of a defective/non-defective condition of each inspected circuit or circuit element without setting probes directly on wirings or terminals. The possibility of minute dust being produced by setting probes is eliminated to prevent a reduction in yield in subsequent processes. The inspection method of the present invention, unlike optical inspection methods, enables determination of defective/non-defective results of all the pattern forming steps by one inspection step, thus simplifying the inspection step.

What is claimed is:

1. A method of manufacturing a semiconductor device, comprising:

forming at least a pixel portion comprising a first thin film transistor and a drive circuit comprising a second thin film transistor over a substrate;

operating the pixel portion and the drive circuit by applying a voltage to the pixel portion and the drive circuit in a non-contact manner;

reading a voltage output from the pixel portion and the drive circuit in a non-contact manner; and inspecting an operating condition of the pixel portion and the drive circuit in a non-contact manner.

2. A method according to claim 1, wherein the method further comprises a step of forming a coil and a wiring electrically connecting the coil with the pixel portion and the drive circuit, over the substrate.

3. A method of manufacturing a semiconductor device, comprising:

forming at least a pixel portion comprising a first thin film transistor and a drive circuit comprising a second thin film transistor over a substrate;

operating the pixel portion and the drive circuit by applying a voltage to the pixel portion and the drive circuit in a non-contact manner;

forming a modulated signal by modulating an ac voltage with a voltage output from the pixel portion and the drive circuit;

reading a voltage of the modulated signal in a non-contact manner; and inspecting the operating condition of the pixel portion and the drive circuit in a non-contact manner.

4. A method according to claim 3, wherein the method further comprises a step of forming a coil and a wiring electrically connecting the coil with the pixel portion and the drive circuit, over the substrate.

5. A method of manufacturing an article, comprising:

manufacturing a circuit or a circuit element, a first coil, a second coil, a third coil, and a fourth coil;

applying a first ac voltage between a pair of terminals of the first coil;

overlapping the first coil and the second coil with a certain spacing set therebetween;

forming a signal for operating the circuit or the circuit element from a second ac voltage generated between a pair of terminals of the second coil;

operating the circuit or the circuit element by inputting the signal to the circuit or the circuit element;

forming a modulated signal by modulating a third ac voltage with a voltage output from the circuit or the circuit element;

applying a voltage of the modulated signal between a pair of terminals of the third coil;

overlapping the third coil and the fourth coil with a certain spacing set therebetween; and inspecting an operating condition of the circuit or the circuit element through a fourth ac voltage generated between a pair of terminals of the fourth coil.

6. A method according to claim 5, wherein the article is a semiconductor device.

7. A method according to claim 5, wherein the article is a element substrate.

8. A method of manufacturing a semiconductor device, comprising:

forming at least a pixel portion comprising a first thin film transistor and a drive circuit comprising a second thin film transistor, a first coil, and a second coil, over a substrate;

applying a first ac voltage between a pair of terminals of a third coil;

overlapping the first coil and the third coil with a certain spacing set therebetween;

forming a signal for operating the pixel portion and the drive circuit from a second ac voltage generated between a pair of terminals of the second coil;

operating the pixel portion and the drive circuit by inputting the signal to the pixel portion and the drive circuit;

forming a modulated signal by modulating a third ac voltage with a voltage output from the pixel portion and the drive circuit;

applying a voltage the modulated signal between a pair of terminals of a fourth coil;

overlapping the second coil and the fourth coil with a certain spacing set therebetween; and inspecting an operating condition of the pixel portion and the drive circuit through a fourth ac voltage generated between a pair of terminals of the second coil, in a non-contact manner.

* * * * *